US012575375B2

(12) United States Patent
Atwood et al.

(10) Patent No.: US 12,575,375 B2
(45) Date of Patent: *Mar. 10, 2026

(54) TRANSPORT APPARATUS AND ADAPTER PENDANT

(71) Applicant: Brooks Automation US, LLC, Chelmsford, MA (US)

(72) Inventors: Dana L. Atwood, Dracut, MA (US); Jairo Moura, Marlborough, MA (US)

(73) Assignee: BROOKS AUTOMATION US, LLC, Chelmsford, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/329,622

(22) Filed: Jun. 6, 2023

(65) Prior Publication Data

US 2025/0096029 A1      Mar. 20, 2025

Related U.S. Application Data

(60) Continuation of application No. 17/158,523, filed on Jan. 26, 2021, now Pat. No. 11,670,534, which is a (Continued)

(51) Int. Cl.
*G05B 19/042* (2006.01)
*B25J 9/16* (2006.01)

(Continued)

(52) U.S. Cl.
CPC .......... *H01L 21/68707* (2013.01); *B25J 9/16* (2013.01); *G05B 19/421* (2013.01);

(Continued)

(58) Field of Classification Search
CPC ......... H01L 21/68707; H01L 21/67167; H01L 21/67196; H01L 21/67201;

(Continued)

(56) References Cited

U.S. PATENT DOCUMENTS 5,705,906 A      1/1998   Tanabe et al.
5,937,143 A      8/1999   Watanabe et al.
(Continued)

FOREIGN PATENT DOCUMENTS

CN      105814677      7/2016
CN      108027718      5/2018
(Continued)

*Primary Examiner* — B M M Hannan

(74) *Attorney, Agent, or Firm* — Perman & Green, LLP

(57) ABSTRACT

A semiconductor process transport apparatus including a drive section with at least one motor, an articulated arm coupled to the drive section for driving articulation motion, a machine controller coupled to the drive section to control the at least one motor moving the articulated arm from one location to a different location, and an adapter pendant having a machine controller interface coupling the adapter pendant for input/output with the machine controller, the adapter pendant having another interface, configured for connecting a fungible smart mobile device having predetermined resident user operable device functionality characteristics, wherein the other interface has a connectivity configuration so mating of the fungible smart mobile device with the other interface automatically enables configuration of at least one of the resident user operable device functionality characteristics to define an input/output to the machine controller effecting input commands and output signals for motion control of the articulated arm.

18 Claims, 22 Drawing Sheets

Related U.S. Application Data division of application No. 16/029,320, filed on Jul. 6, 2018, now Pat. No. 10,903,107.

(60) Provisional application No. 62/531,218, filed on Jul. 11, 2017.

(51) Int. Cl.

| | |
|---|---|
| *G05B 19/421* | (2006.01) |
| *H01L 21/67* | (2006.01) |
| *H01L 21/677* | (2006.01) |
| *H01L 21/687* | (2006.01) |

(52) U.S. Cl.

CPC .. *H01L 21/67167* (2013.01); *H01L 21/67196* (2013.01); *H01L 21/67201* (2013.01); *H01L 21/67253* (2013.01); *H01L 21/67276* (2013.01); *H01L 21/67706* (2013.01); *H01L 21/67742* (2013.01); *G05B 19/0423* (2013.01); *G05B 2219/2602* (2013.01)

(58) Field of Classification Search

CPC ......... H01L 21/67253; H01L 21/67276; H01L 21/67706; H01L 21/67742; B25J 9/16; G05B 19/421; G05B 19/0423; G05B 2219/2602

USPC ........................................................ 700/264

See application file for complete search history.

(56) References Cited

U.S. PATENT DOCUMENTS

| | | | |
|---|---|---|---|
| 6,242,879 | B1 | 6/2001 | Sagues et al. |
| 6,502,054 | B1 | 12/2002 | Mooring et al. |
| 9,415,514 | B2 | 8/2016 | Geheb et al. |
| 9,711,040 | B2 | 7/2017 | Saito et al. |
| 10,777,438 | B2 | 9/2020 | Caveney et al. |
| 2002/0002422 | A1 | 1/2002 | Kondo et al. |
| 2002/0192056 | A1 | 12/2002 | Reimer et al. |
| 2005/0096794 | A1 | 5/2005 | Yim et al. |
| 2006/0062265 | A1 | 3/2006 | Denney et al. |
| 2006/0138989 | A1* | 6/2006 | Yuasa .................. G05B 19/427 318/568.13 |
| 2006/0287769 | A1 | 12/2006 | Yanagita et al. |
| 2007/0065144 | A1 | 3/2007 | Hofmeister et al. |
| 2007/0164696 | A1 | 7/2007 | Henne |
| 2008/0097646 | A1 | 4/2008 | Ramsey et al. |
| 2008/0206023 | A1 | 8/2008 | Smith et al. |
| 2008/0249651 | A1 | 10/2008 | Hosek et al. |
| 2009/0266194 | A1 | 10/2009 | Zhang et al. |
| 2010/0017033 | A1 | 1/2010 | Boca |
| 2011/0118875 | A1 | 5/2011 | Hosek |
| 2011/0190938 | A1 | 8/2011 | Ekelund et al. |
| 2012/0128450 | A1 | 5/2012 | Caveney et al. |
| 2013/0183131 | A1 | 7/2013 | Blank et al. |
| 2014/0067128 | A1 | 3/2014 | Kowalski et al. |
| 2014/0126987 | A1 | 5/2014 | Gilchrist et al. |
| 2015/0127124 | A1 | 5/2015 | Kobayashi |
| 2015/0221534 | A1 | 8/2015 | Van Der Meulen |
| 2015/0258693 | A1 | 9/2015 | Yazawa et al. |
| 2015/0303083 | A1 | 10/2015 | Wakabayashi |
| 2015/0352718 | A1 | 12/2015 | Lee et al. |
| 2015/0371883 | A1 | 12/2015 | Takahashi et al. |
| 2016/0031089 | A1 | 2/2016 | One et al. |
| 2016/0297067 | A1 | 10/2016 | Kogan et al. |
| 2016/0327383 | A1 | 11/2016 | Becker et al. |
| 2017/0120440 | A1 | 5/2017 | Guerin et al. |
| 2017/0232611 | A1 | 8/2017 | Himes, Jr. |
| 2019/0181027 | A1 | 6/2019 | Yoshida et al. |

FOREIGN PATENT DOCUMENTS

| | | | | |
|---|---|---|---|---|
| EP | 0792726 | | 6/1999 | |
| JP | 2006277531 | A * | 10/2006 | |
| JP | 2007152541 | | 6/2007 | |
| JP | 201313132728 | | 7/2013 | |
| JP | 5307491 | | 10/2013 | |
| JP | 2013251651 | | 12/2013 | |
| JP | 2014050951 | | 3/2014 | |
| JP | 2015020215 | | 2/2015 | |
| JP | 2016060018 | | 4/2016 | |
| JP | 2016060020 | | 4/2016 | |
| JP | 2016068242 | | 5/2016 | |
| WO | WO-2011049136 | A1 * | 4/2011 | ............ B25J 9/1674 |
| WO | 2015137135 | | 9/2015 | |
| WO | 2016179448 | | 11/2016 | |

* cited by examiner

GUI

503P

597

550

540

BACK TO HOME BASE

| COLOR CODE |
|---|
| NORMAL |
| WARNING |
| FAIL |

| STATUS INDICATORS | |
|---|---|
| MOTOR OPERATION | ENCODER OPERATION |
| PROCESSOR UTILIZATION | NETWORK UTILIZATION |
| VIBRATION LEVELS | ENERGY CONSUMPTION |

598

STOP!

500

600 — PROVIDE AN ARTICULATED ARM COUPLED TO A DRIVE SECTION

605 — OPERABLY COUPLE MACHINE CONTROLLER TO DRIVE SECTION

610 — OPERABLY COUPLE ADAPTER PENDANT TO MACHINE CONTROLLER

615 — OPERABLY COUPLE ADAPTER PENDANT TO FUNGIBLE MOBILE SMART DEVICE

620 — AUTOMATICALLY CONFIGURE AT LEAST ONE RESIDENT USER OPERABLE DEVICE FUNCTIONALITY

621 — EFFECT CLOSE COUPLING

625 — INITIALIZE LOCKOUT

TRANSPORT APPARATUS AND ADAPTER PENDANT

CROSS REFERENCE TO RELATED APPLICATIONS

This application is a continuation of U.S. application Ser. No. 17/158,523, filed on Jan. 26, 2021, (now U.S. Pat. No. 11,670,534), which is a divisional of U.S. application Ser. No. 16/029,320, filed Jul. 6, 2018, (now U.S. Pat. No. 10,903,107), which is non-provisional of and claims the benefit of U.S. Provisional Patent Application No. 62/531, 218, filed on Jul. 11, 2017, the disclosures of which are incorporated herein by reference in their entireties.

BACKGROUND

1. Field

The exemplary embodiments generally relate to semiconductor processing equipment, and more particularly, semiconductor process transport apparatus.

2. Brief Description of Related Developments

Semiconductor automation robots are special components employed to handle substrates that are used for as memory chips and semiconductor chip manufacturing such processors. As part of the semiconductor tool automation setup, teach pendants are used to manually command movement of the robot to teach the robot locations of tool processes stations in the robot coordinate system. These teach pendants allow a local operator to manually command the robot motion at targeted process station locations and effectively store the coordinates of each targeted process station.

Conventional teach pendants are specialized devices that generally have a touch pad keyboard with a limited screen size. Conventional teach pendants also generally have multiple navigation steps to accomplish other functional tasks including, but not limited to, jogging, configuring robot parameters, moving to specific absolute coordinates, reporting robot positions, etc. Functional demands for teach pendants for semiconductor automation continues to increase in complexity as automation equipment functionality expands. Conventional teach pendants capable of handling complex tasks are expensive relative to the cost of the automation equipment, making teach pendants undesirable in the marketplace. For some automation equipment, laptop or desktop computers, with graphical user interfaces, are used instead of a teach pendant (forgoing the mobility and flexibility in usage thereof) so that the user of the automation equipment does not incur the added cost of purchasing the costly teach pendant. Conventional teach pendant firmware is also specific to particular robots/tools which would require an end user to have multiple teach pendants. Upgrades and revisions to teach pendant firmware is difficult to perform on fielded units and teach pendant menus can be cumbersome to navigate leading to unwanted equipment setup time in a production environment. Conventional teach pendants also require training for usage, with separate product manuals for reference.

In addition, in order to meet requirements of the 2006/42/EC machinery directive, teach pendants with an emergency stop and three-position live-man or enabling switch may be sought for service activities of the robot. Available conventional teach pendants with the emergency stop and live-man switch features are self-contained units, usually hardwired to the respective robot/tool, without internet access and very little flexibility for functional customization.

BRIEF DESCRIPTION OF THE DRAWINGS

The foregoing aspects and other features of the disclosed embodiment are explained in the following description, taken in connection with the accompanying drawings, wherein:

FIG. 5I is a schematic illustration of a portion of the graphical user interface of FIG. 5A in accordance with aspects of the disclosed embodiment.

DETAILED DESCRIPTION

Figures 1A, 1B, 1F:
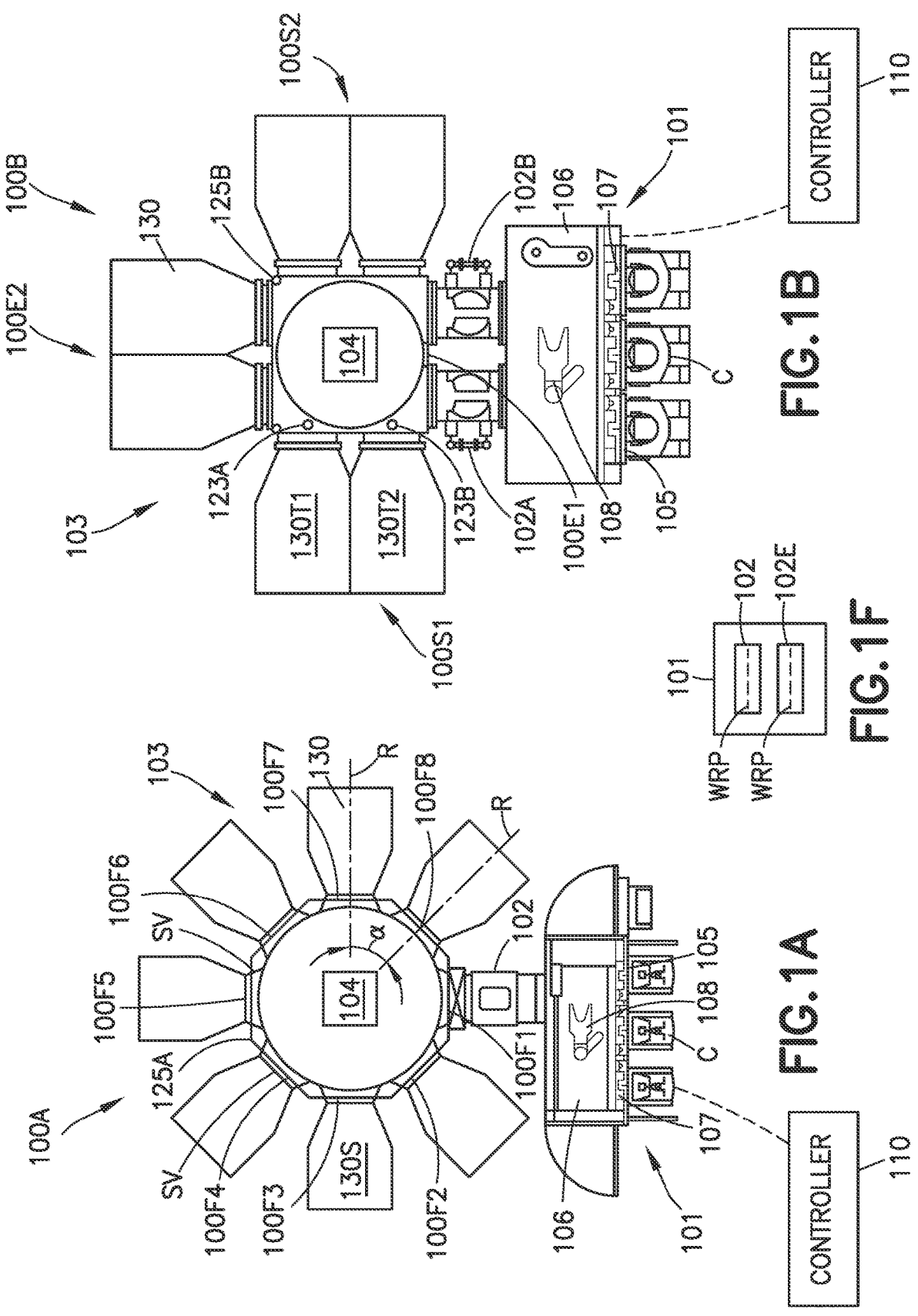
FIGS. 1A-1D are schematic illustrations of processing apparatus incorporating aspects of the disclosed embodiment.
FIGS. 1E and 1F are schematic illustrations of portions of the processing apparatus of FIGS. 1A-1D and 1G-1M.

FIGS. 1A-1M illustrate exemplary substrate processing systems in accordance with aspects of the disclosed embodiment. Although the aspects of the disclosed embodiment will be described with reference it should be to the drawings, understood that the aspects of the disclosed embodiment can be embodied in many forms. In addition, any suitable size, shape or type of elements or materials could be used. It should also be understood that while the aspects of the disclosed embodiment are described herein with respect to semiconductor processing systems, in other aspects disclosed embodiment may be applied to any suitable industry that utilizes automation equipment (e.g., robotic manipulators, automated guided vehicles, etc.) for assembly and/or manufacturing including but not limited to, automotive, aerospace and maritime industries.

The aspects of the disclosed embodiment leverage fungible smart devices (e.g., smart phones and tablet devices) to accomplish teach pendant functionality. The aspects of the disclosed embodiment not only reduce the cost of producing and/or purchasing original equipment manufacturer (OEM) hardware (e.g., the conventional specialized teach pendant and all of the electronics and hardware associated with the conventional specialized teach pendant), but also increases the functionality of the teach pendant to add value to the product and to the end user. The increased functionality may include features such as, for example, an easy to use Web-based interface with a touch screen (e.g., graphical user interface) with highly customizable menus, process station teaching with minimum navigation through teach pendant menus and minimized setup times (e.g., which may result in increased productivity), an ability to query and monitor robot health status and fault diagnostics, an ability to perform firmware upgrades and backup from the robot controller, an ability to program and run test scripts for robot operation and validation, the ability to monitor robot arm, drive and chamber temperatures in order to enable for thermal expansion compensation, the ability to implement automated teaching (referred to as "AutoTeach") algorithms for robot stations (such as, e.g., disclosed in U.S. patent application Ser. No. 14/937,676 filed on Nov. 10, 2015 and entitled "Tool AutoTeach Methods and Apparatus", the disclosure of which is incorporated herein by reference in its entirety), the ability to provide robot motion and location animation relative to the stations for remote monitoring, the ability to provide user access to, for example, any suitable information/documentation, from automation equipment and/or the Internet, that includes (but is not limited to) semiconductor equipment applications (such as applications SDP1-SDPn, which are installed on the fungible smart mobile device SD), product manuals, command syntax, service bulletins, firmware (or other) upgrade instructions, repair instructions, and troubleshooting guides, and the ability to leverage on-board sensing capabilities embedded on smart devices to assist with teaching and diagnostics such as checks for station leveling, vibration monitoring and automatic teaching of the robot. These on-board sensing capabilities enable the robot 104R software to assess additional information that can be used for more advanced algorithms for, as a non-exhaustive list of non-limiting examples, fault diagnostics, health monitoring, automated teaching, advanced control algorithms, and thermal expansion compensation.

In addition to the above, the utilization of such fungible smart mobile devices SD also enables the user or the robot software to further connect with external devices ED1-EDn (see FIG. 4), including, but not limited to, e.g., cameras, temperature sensors, accelerometers, humidity sensors, gas flow meters, and vacuum quality gauges. The type of connection to such external devices ED1-EDn can be established by leveraging the existing capabilities of the fungible smart mobile device SD interfaces such as Bluetooth® or Wifi. For example, the external devices ED1-EDn may include any suitable wireless connectivity for communicating with the fungible smart mobile device SD over any suitable wireless connection 497 (FIG. 4) so that data received, sensed or collected by the external device(s) ED1-EDn is wirelessly communicated from the external device(s) ED1-EDn to the fungible smart mobile device SD.

The adapter pendant 400 (see FIGS. 2, 4A and 4B) can also be designed to further supplement interfaces for enhanced connectivity with the semiconductor fabrication facility FAB environment such as operating as slaved device in any suitable network 258 of the fabrication facility FAB such as an EtherCat® network, where the adapter pendant 400 is configured as an EtherCat® slave. This would allow the user to customize information/data from the robot 104R or connected sensors ED1-EDn to be streamed into a fabrication facility FAB network 258 (or from the FAB network 258 to the adapter pendant 400), such as the EtherCat® network. In one aspect, the adapter pendant 400 (and fungible smart mobile device SD coupled thereto) may receive any suitable data from other robots/tools or any other suitable automation of the fabrication facility to effect teaching of the robot 104R to which the adapter pendant 400 is coupled. Another aspect of the disclosed embodiment is that the adapter pendant 400 device can also support backwards compatible interfaces to old robot controllers such as those with RS-232 Serial ports. This allows for the utilization of fungible smart mobile devices SD to also be used to teach and monitor older or "legacy" products. It is noted that the abilities mentioned above do not require any physical modifications to the fungible smart mobile device SD. Any hardware "customization" can be implemented as part of the adapter pendant 400. However, this "customization" is not mandatory since it can be used with the purpose of enhancing or expanding the range of interfacing or connectivity capabilities of the disclosed embodiment.

Figure 2:
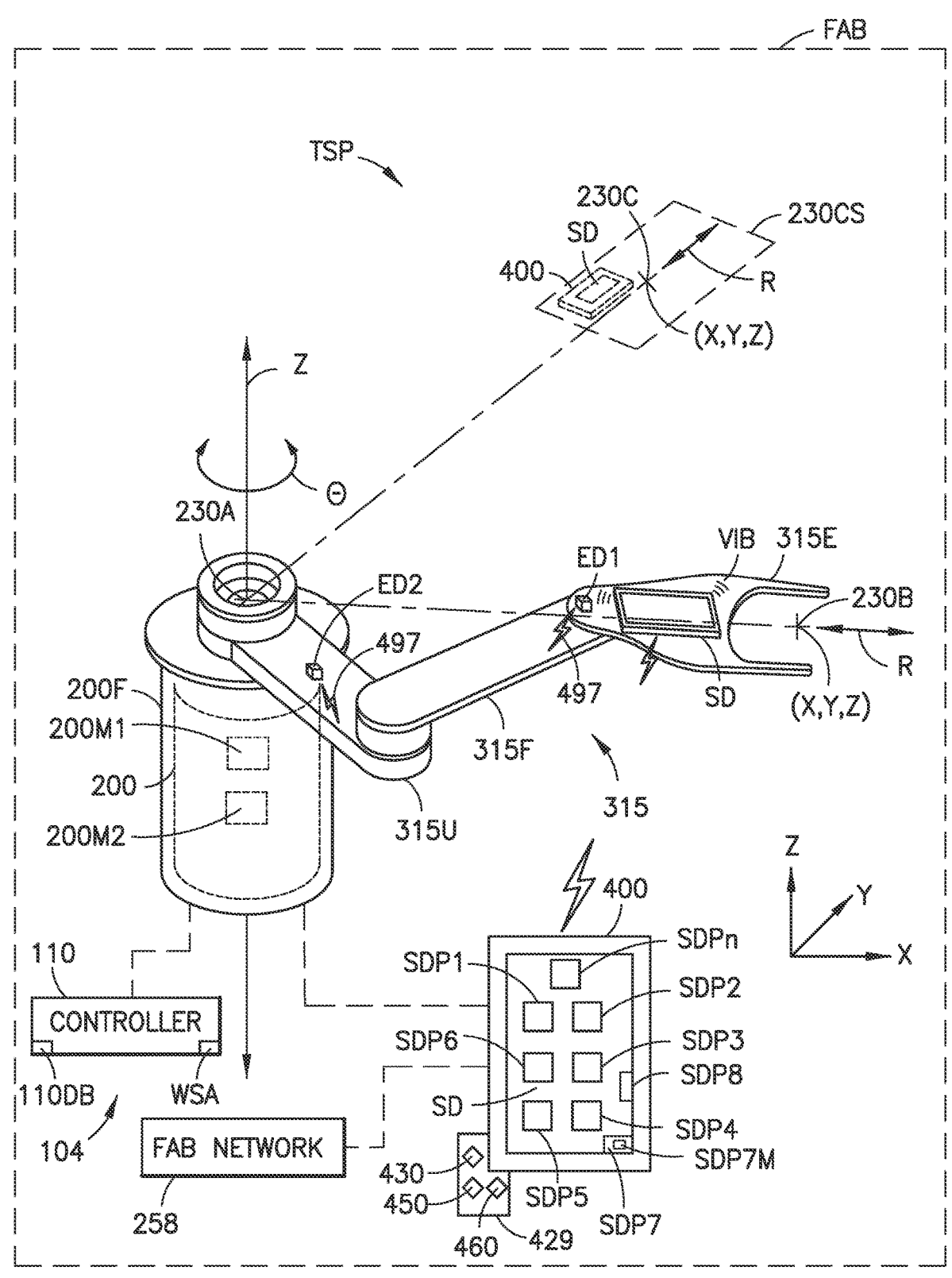
FIG. 2 is a schematic illustration of a semiconductor process transport apparatus in accordance with aspects of the disclosed embodiment.
Figure 4A:
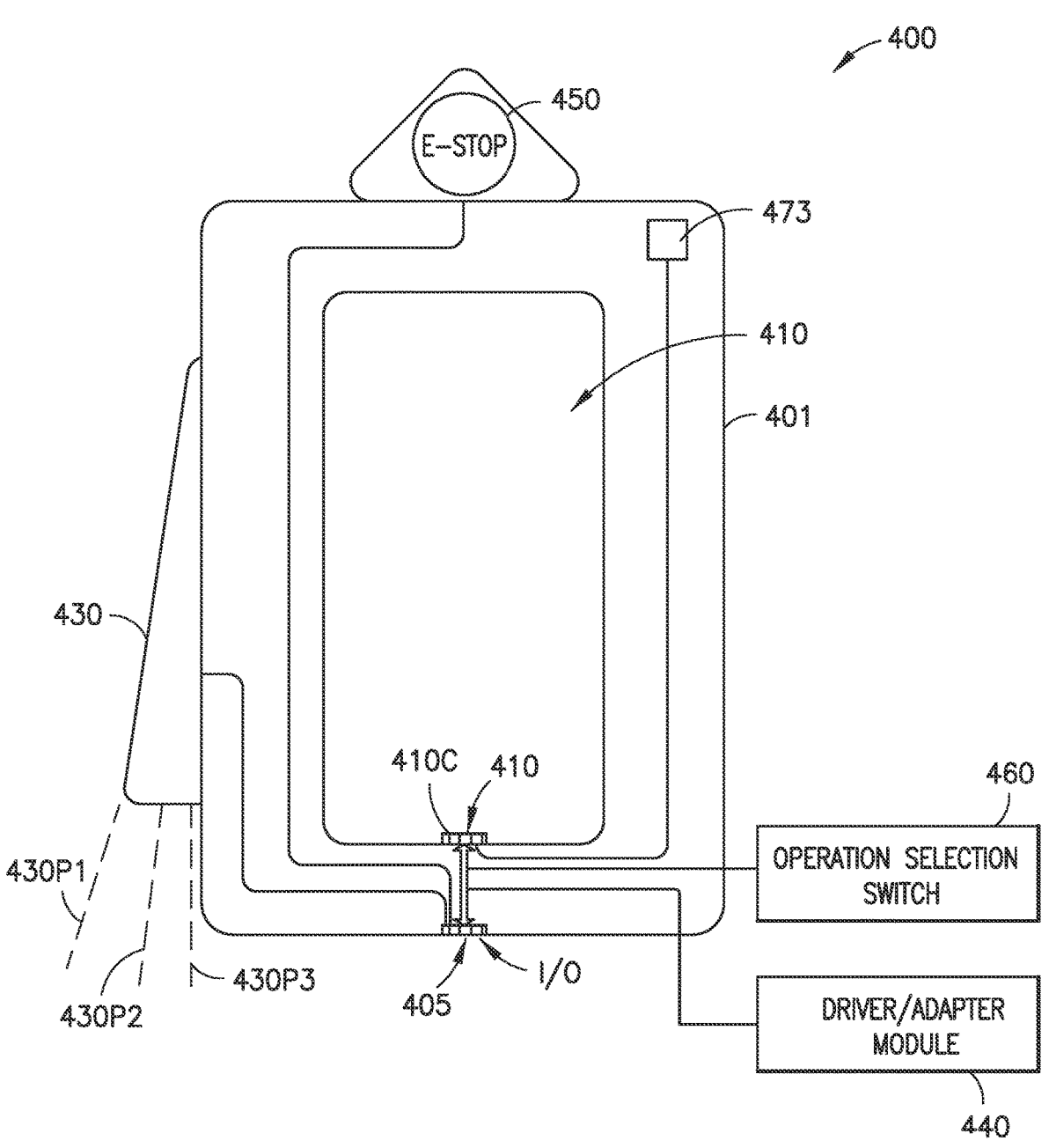
FIG. 4A is a schematic illustration of an adapter pendant of the semiconductor process transport apparatus in accordance with aspects of the disclosed embodiment.
Figure 4B:
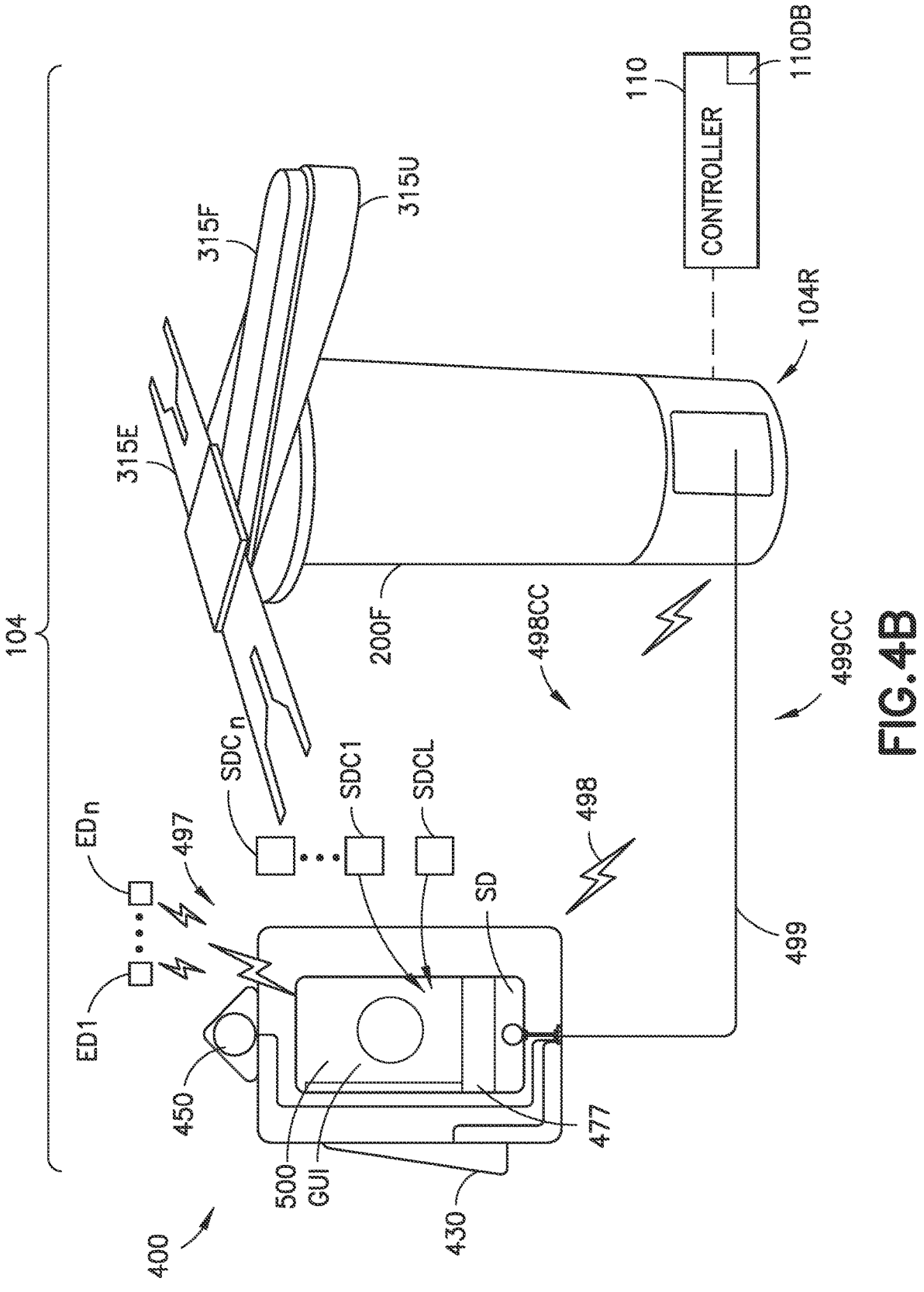
FIG. 4B is a schematic illustration of a semiconductor transport apparatus in accordance with aspects of the process disclosed embodiment.

The abilities described above (and described in further detail herein) may be provided by/in any suitable applications/functionalities (see the built-in features and/or applications SDP1-SDPn shown in FIG. 2, which may be one or more of the user operable device functionality characteristics SDC1-SDCn shown in FIG. 4B and described herein) which are downloaded to a fungible smart mobile device SD and run by any suitable application program interface (API) of the fungible smart mobile device SD. In one aspect, the applications/functionalities may be a single application for one more abilities, or multiple applications/functionalities for one or more abilities. The features/abilities as described herein and effected by the one or more applications/functionalities and/or sensors resident on the fungible smart mobile device SD are close coupled via an adapter pendant 400 (FIGS. 2, 4A and 4B) to a transport robot 104R machine controller 110 as will be described further below. The close coupling has no intervening robot 104R motion command interface that intervenes (so as to reconfigure or repeat/resend input/output) between user selectable input/output, on the fungible smart mobile device SD, the motion commands/user selections (e.g. robot 104R motion commands that inform robot motion, the initial location (such as one of locations 230A-230C—FIG. 2), the other location (such as one of location 230A-230C—FIG. 2), all that are freely selectable, by the user selection on the input/output) generated therefrom and the machine controller 110.

In accordance with aspects of the disclosed embodiment, an adapter pendant 400 (FIGS. 2, 4A and 4B) is provided. The adapter pendant 400 is a handheld cradle (e.g., a "Smart" cradle) with a universal mounting/coupling for holding the fungible smart mobile device SD (FIGS. 2 and 4B) (e.g., such as a smart phone or tablet) having predetermined resident user operable device functionality characteristics SDC1-SDCn (e.g., applications, program modules, at least one sensor, data logging function, a graphic display, recording function (e.g., video and/or audio or other data), etc.) resident on the fungible smart mobile device SD (FIG. 4B). In one aspect of the disclosed embodiment, the fungible smart mobile devices SD may be generally fungible devices, that is, one fungible smart mobile device SD may be interchangeable with any other fungible smart mobile device SD. Thus, fungible smart mobile device 16 is not a specialized device and has no specific intrinsic structure desirable for operation of the semiconductor process transport apparatus 104 as described herein, instead relying on an application downloaded and installed on the fungible smart mobile device SD for operation of the semiconductor process transport apparatus 104. IN one aspect, the fungible smart mobile device SD can be used to perform teach pendant functionality (such as teaching locations of robot/substrate holding stations as described before) without the need of any special application loaded in this device. In this case, the user would utilize a Web-based browser (such as Google Chrome™, Mozilla® Firefox®, Microsoft Internet Explorer®, Apple Safari™, or any other suitable Web-based browser which may be one of the resident user operable device functionality characteristics SDC1-SDCn) to connect to the robot controller 110 in which a web server application WSA, responsible to establish the connectivity and implement the robot 104R control and data collection aspects of the present disclosure (as described herein), resides. Were a web-based browser is used to connect to the web server application WSA of the controller 110, the web server application WSA may be accessed through a web-address, an Internet Protocol (IP) address, or in any other suitable manner through the web-based browser. The adapter pendant 400, which will be described in greater detail below, remedies the deficiencies of the conventional teach pendants noted above, as well as provides the aforementioned advantages of reducing manufacturing/purchase cost of teach pendants and increases the functionality of the teach pendant to add value to the product and to the end user. The aspects of the disclosed embodiment may be used with any suitable processing apparatus such as the processing apparatus 100A, 100B, 100C, 100D, 100E, 100F, 100G, 100H, or any other suitable automated apparatus that uses teach pendants.

Figures 1C, 1D, 1E:
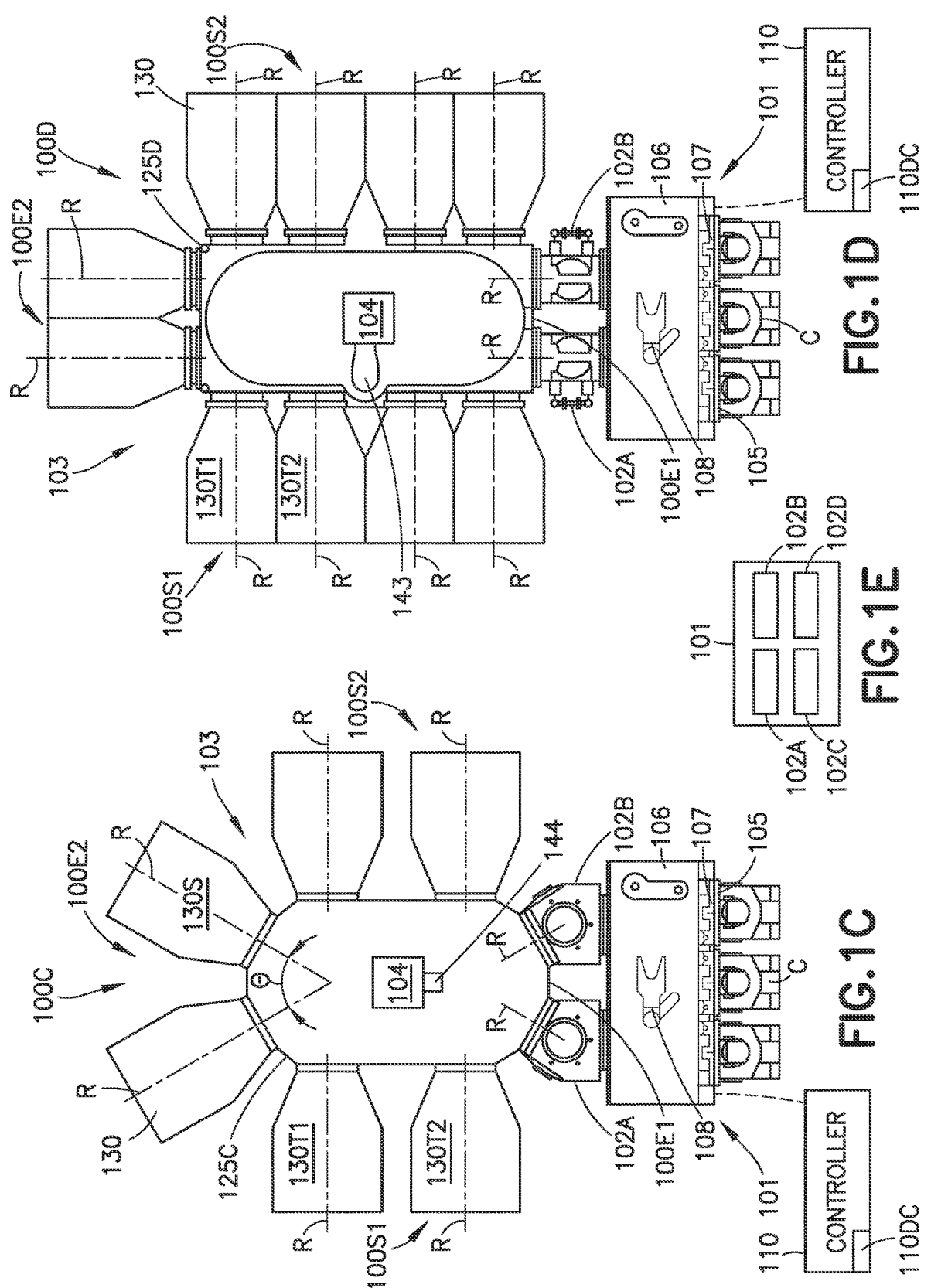
Figures 1G, 1H, 1I:
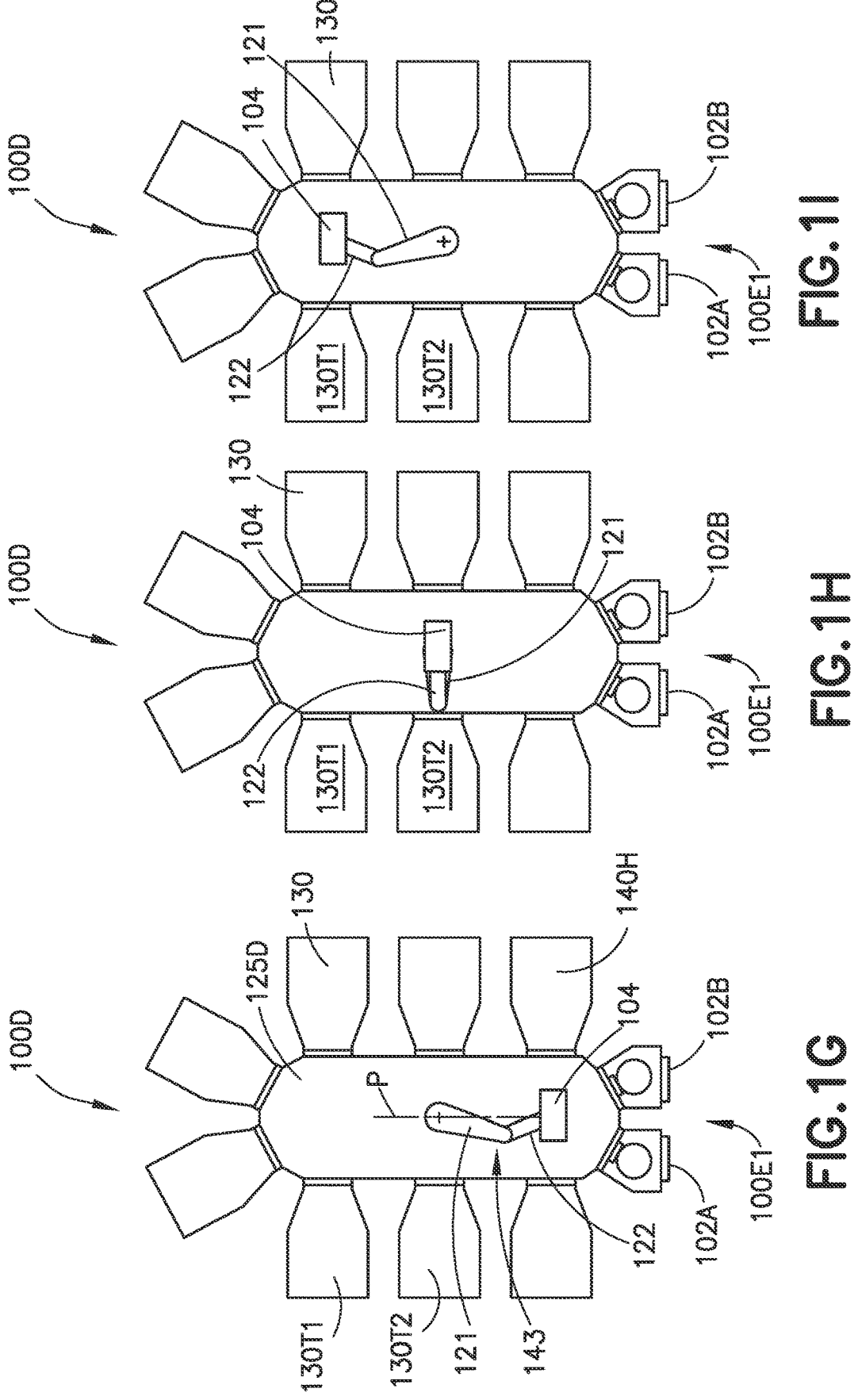
FIGS. 1G-1M are schematic illustrations of processing apparatus incorporating aspects of the disclosed embodiment.
Figure 1J:
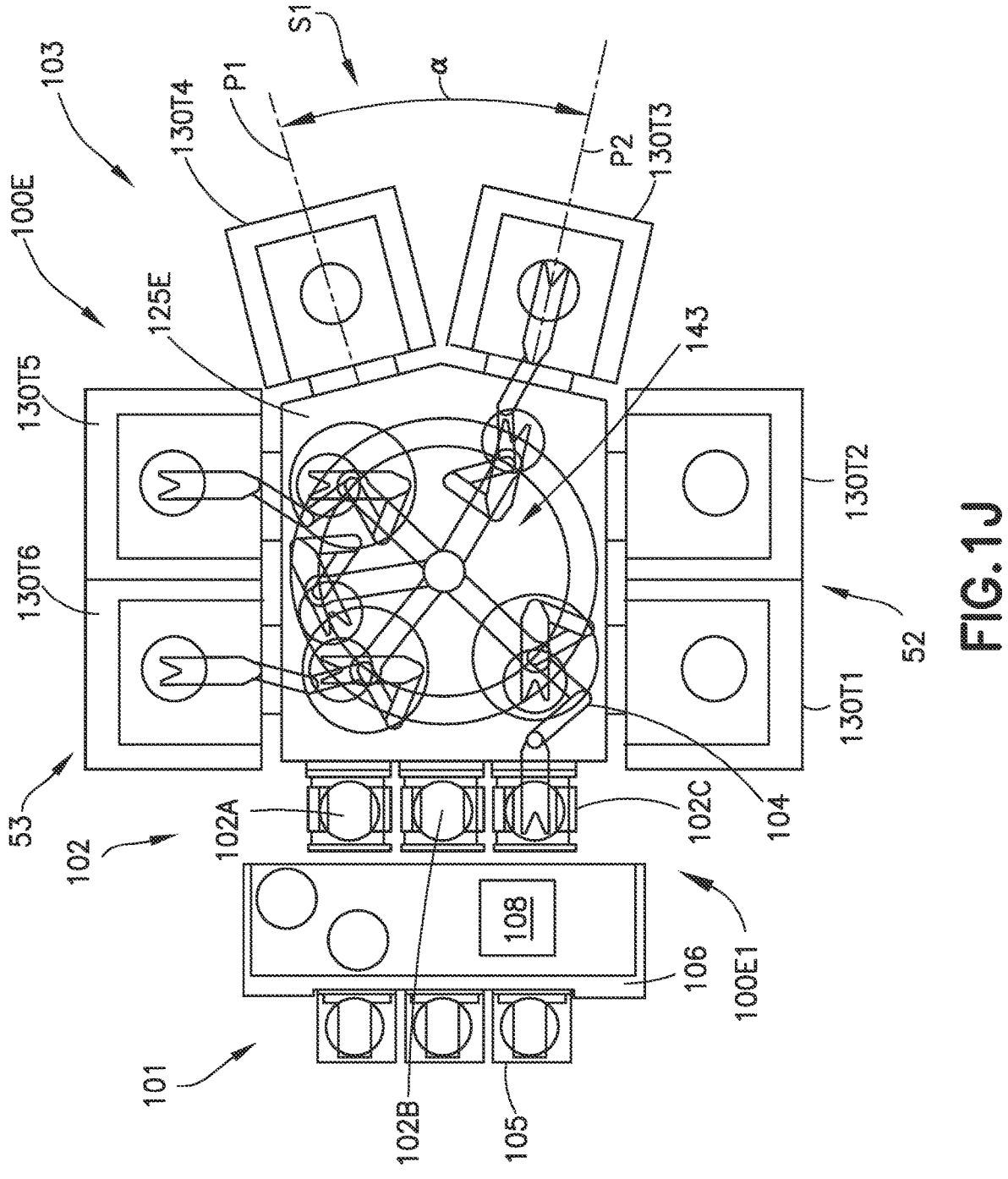
Figure 1K:
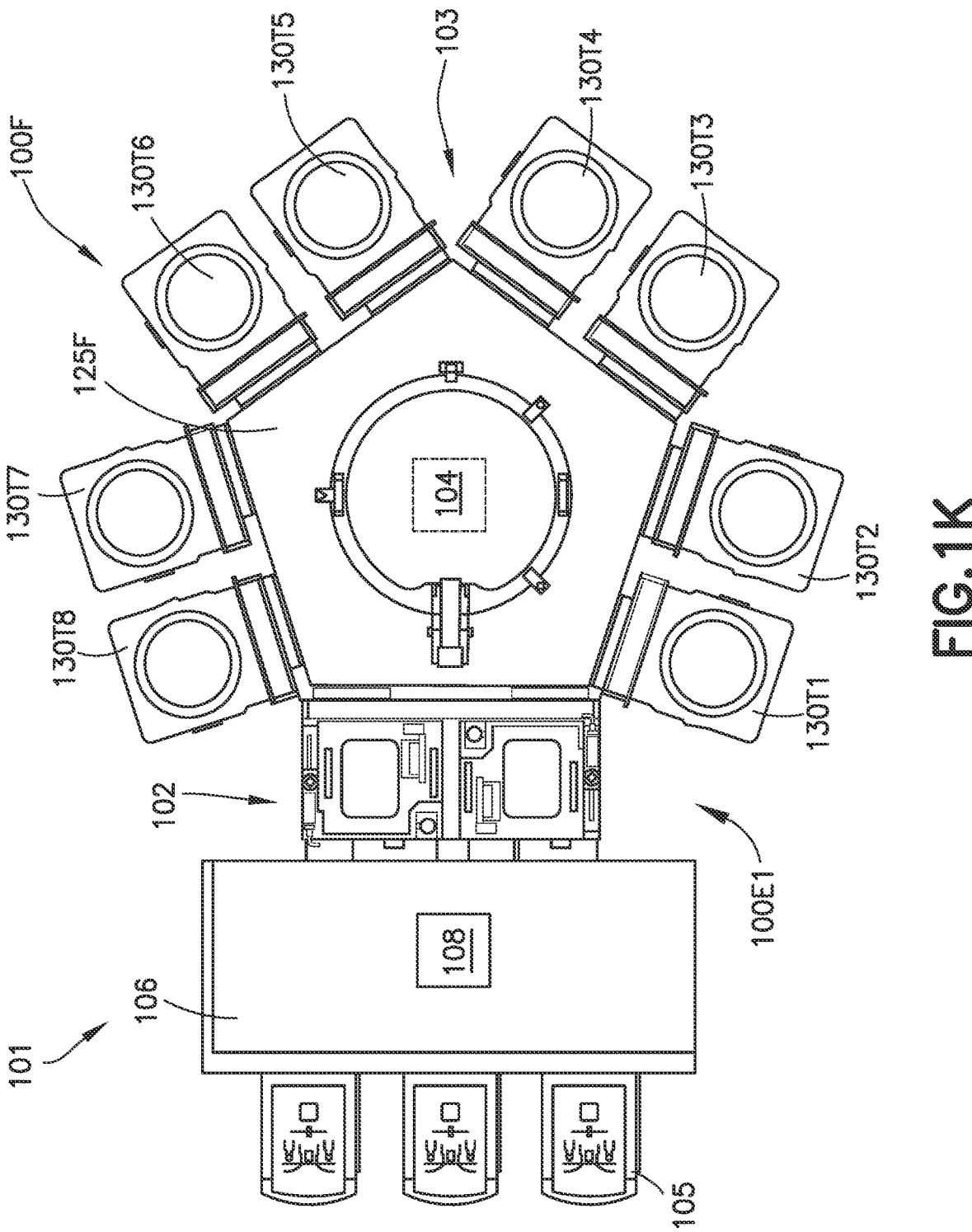

The processing apparatus 100A, 100B, 100C, 100D, 100E, 100F, 100G, 100H such as for example a semiconductor tool station, is shown in accordance with aspects of the disclosed embodiment. Although a semiconductor tool station is shown in the drawings, the aspects of the disclosed embodiment described herein can be applied to any tool station or application employing robotic manipulators. In one aspect the processing apparatus 100A, 100B, 100C, 100D, 100E, 100F are shown as having cluster tool arrangements (e.g. having substrate holding stations connected to a central chamber) while in other aspects the processing apparatus may be a linearly arranged tool 100G, 100H, as described in U.S. Pat. No. 8,398,355, entitled "Linearly Distributed Semiconductor Workpiece Processing Tool," issued Mar. 19, 2013 (the disclosure of which is incorporated herein by reference in its entirety); however the aspects of the disclosed embodiment may be applied to any suitable tool station. The apparatus 100A, 100B, 100C, 100D, 100E, 100F, 100G, 100H generally include an atmospheric front end 101, at least one vacuum load lock 102, 102A, 102B, 102C and a vacuum back end 103. The at least one vacuum load lock 102, 102A, 102B, 102C may be coupled to any suitable port(s) or opening(s) of the front end 101 and/or back end 103 in any suitable arrangement. For example, in one aspect the one or more load locks 102, 102A, 102B, 102C may be arranged in a common horizontal plane in a side by side arrangement as can be seen in FIGS. 1B-1D and 1G-1K. In other aspects the one or more load locks may be arranged in a grid format such that at least two load locks 102A, 102B, 102C, 102D are arranged in rows (e.g. having spaced apart horizontal planes) and columns (e.g. having spaced apart vertical planes) as shown in FIG. 1E. In still other aspects the one or more load lock may be a single in-line load lock 102 as shown in FIG. 1A. In yet another aspect the at least one load lock 102, 102E may be arranged in a stacked in-line arrangement as shown in FIG. 1F. It should be understood that while the load locks are illustrated on end 100E1 or facet 100F1 of a transport chamber 125A, 125B, 125C, 125D in other aspects the one or more load lock may be arranged on any number of sides 100S1, 100S2, ends 100E1, 100E2 or facets 100F1-100F8 of the transport chamber 125A, 125B, 125C, 125D. Each of the at least one load lock may also include one or more wafer/substrate resting planes WRP (FIG. 1F) in which substrates are held on suitable supports within the respective load lock. In other aspects, the tool station may have any suitable configuration. The components of each of the front end 101, the at least one load lock 102, 102A, 102B, 102C and back end 103 may be connected to a machine controller 110 which may be part of any suitable control architecture such as, for example, a clustered architecture control. The control system may be a closed loop controller having a master controller (which in one aspect may be machine controller 110), cluster controllers and autonomous remote controllers such as those disclosed in U.S. Pat. No. 7,904,182 entitled "Scalable Motion Control System" issued on Mar. 8, 2011 the disclosure of which is incorporated herein by reference in its entirety. In other aspects, any suitable controller and/or control system may be utilized. The machine controller 110 is operably coupled to the drive section 200 (FIG. 2) of the transport apparatus 104 so as to control the at least one motor 200M1, 20M2 (FIG. 2) for moving the articulated arm (such as those described herein) from one location 230A, 230B, 230C (FIG. 2) to a different other location 230A, 230B, 230C (FIG. 2), where at least one of the one location 230B, 230C and the other location 230B, 230C is a workpiece holding station in a semiconductor processing apparatus 100A, 100B, 100C, 100D, 100E, 100F, 100G, 100H as described herein.

In one aspect, the front end 101 generally includes load port modules 105 and a mini-environment 106 such as for example an equipment front end module (EFEM). The load port modules 105 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In other aspects, the load port modules may be configured as 200 mm wafer/substrate interfaces, 450 mm wafer/substrate interfaces or any other suitable substrate interfaces such as for example larger or smaller semiconductor wafers/substrates, flat panels for flat panel displays, solar panels, reticles or any other suitable object. Although three load port modules 105 are shown in FIGS. 1A-1D, 1J and 1K, in other aspects any suitable number of load port modules may be incorporated into the front end 101. The load port modules 105 may be configured to receive substrate carriers or cassettes C from an overhead transport system, automatic guided vehicles, person guided vehicles, rail guided vehicles or from any other suitable transport method. The load port modules 105 may interface with the mini-environment 106 through load ports 107. The load ports 107 may allow the passage of substrates between the substrate cassettes and the mini-environment 106. The mini-environment 106 generally includes any suitable transfer robot 108 which may incorporate one or more aspects of the disclosed embodiment described herein. In one aspect the robot 108 may be a track mounted robot such as that described in, for example, U.S. Pat. No. 6,002,840 issued on Dec. 14, 1999; U.S. Pat. No. 8,419,341 issued Apr. 16, 2013; and U.S. Pat. No. 7,648,327 issued on Jan. 19, 2010, the disclosures of which are incorporated by reference herein in their entireties. In other aspects the robot 108 may be substantially similar to that described herein with respect to the back end 103. The mini-environment 106 may provide a controlled, clean zone for substrate transfer between multiple load port modules.

The at least one vacuum load lock 102, 102A, 102B, 102C may be located between and connected to the mini-environment 106 and the back end 103. In other aspects the load ports 105 may be coupled substantially directly to the at least one load lock 102, 102A, 102B, 102C or the transport chamber 125A, 125B, 125C, 125D, 125E, 125F where the substrate carrier C is pumped down to a vacuum of the transport chamber 125A, 125B, 125C, 125D and substrates are transferred directly between the substrate carrier C and the load lock or transfer chamber. In this aspect, the substrate carrier C may function as a load lock such that a processing vacuum of the transport chamber extends into the substrate carrier C. As may be realized, where the substrate carrier C is coupled substantially directly to the load lock through a suitable load port any suitable transfer apparatus may be provided within the load lock or otherwise have access to the carrier C for transferring substrates to and from the substrate carrier C. It is noted that the term vacuum as used herein may denote a high vacuum such as $10^{-5}$ Torr or below in which the substrates are processed. The at least one load lock 102, 102A, 102B, 102C generally includes atmospheric and vacuum slot valves. The slot valves of the load locks 102, 102A, 102B (as well as for the processing stations 130) may provide the environmental isolation employed to evacuate the load lock after loading a substrate from the atmospheric front end and to maintain the vacuum in the transport chamber when venting the lock with an inert gas such as nitrogen. As will be described herein, the slot valves of the processing apparatus 100A, 100B, 100C, 100D, 100E, 100F (as well as linear processing apparatus 100G, 100H) may be located in the same plane, different vertically stacked planes or a combination of slot valves located in the same plane and slot valves located in different vertically stacked planes (as described above with respect to the load ports) to accommodate transfer of substrates to and from at least the processing stations 130 and load locks 102, 102A, 102B, 102C coupled to the transport chamber 125A, 125B, 125C, 125D, 125E, 125F. The at least one load lock 102, 102A, 102B, 102C (and/or the front end 101) may also include an aligner for aligning a fiducial of the substrate to a desired position for processing or any other suitable substrate metrology equipment. In other aspects, the vacuum load lock may be located in any suitable location of the processing apparatus and have any suitable configuration.

The vacuum back end 103 generally includes a transport chamber 125A, 125B, 125C, 125D, 125E, 125F one or more processing station(s) or module(s) 130 and any suitable number of semiconductor process transport apparatus 104 (referred to herein as transport apparatus 104) that includes one or more transport robots 104R (each having a drive section 200 with at least one motor 200M1, 200M2 and at least one articulated arm, described below, coupled to the drive section 200 for driving articulated motion of the articulated arm-see FIG. 2) which may include one or more aspects of the disclosed embodiments described herein. The transport chamber 125A, 125B, 125C, 125D, 125E, 125F may have any suitable shape and size that, for example, complies with SEMI standard E72 guidelines. The transport apparatus(es) 104 and the one or more transport robot 104R (which may be substantially similar to those robots described herein) will be described below and may be located at least partly within the transport chamber 125A, 125B, 125C, 125D, 125E, 125F to transport substrates between the load lock 102, 102A, 102B, 120C (or between a cassette C located at a load port) and the various processing stations 130. In one aspect the transport apparatus 104 may be removable from the transport chamber 125A, 125B, 125C, 125D, 125E, 125F as modular unit such that the transport apparatus 104 complies with SEMI standard E72 guidelines.

The processing stations 130 may operate on the substrates through various deposition, etching, or other types of processes to form electrical circuitry or other desired structure on the substrates. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing stations 130 are communicably connected to the transport chamber 125A, 125B, 125C, 125D, 125E, 125F in any suitable manner, such as through slot valves SV, to allow substrates to be passed from the transport chamber 125A, 125B, 125C, 125D, 125E, 125F to the processing stations 130 and vice versa. The slot valves SV of the transport chamber 125A, 125B, 125C, 125D, 125E, 125F may be arranged to allow for the connection of twin (e.g. more than one substrate processing chamber located within a common housing) or side-by-side process stations 130T1-130T8, single process stations 130S and/or stacked process modules/load locks (FIGS. 1E and 1F).

It is noted that the transfer of substrates to and from the processing station 130, load locks 102, 102A, 102B, 102C (or cassette C) coupled to the transfer chamber 125A, 125B, 125C, 125D, 125E, 125F may occur when one or more arms of the transport apparatus 104 are aligned with a predetermined processing station 130 along an axis of extension and retraction R of the transport apparatus 104. In accordance with aspects of the disclosed embodiment one or more substrates may be transferred to a respective predetermined processing station 130 individually or substantially simultaneously (e.g. such as when substrates are picked/placed from side-by-side or tandem processing stations as shown in FIGS. 1B, 1C, 1D and 1G-1K). In one aspect the transport apparatus 104 may be mounted on a boom arm 143 (see e.g. FIGS. 1D and 1G-1I), where the boom arm 143 has a single boom link or multiple boom links 121, 122, or linear carriage 144 such as that described in U.S. provisional patent application Nos. 61/892,849 entitled "Processing Apparatus" and filed on Oct. 18, 2013 and 61/904,908 entitled "Processing Apparatus" and filed on Nov. 15, 2013 and International patent application number PCT/US13/25513 entitled "Substrate Processing Apparatus" and filed on Feb. 11, 2013, the disclosures of which are incorporated herein by reference in their entireties.

Figure 1L:
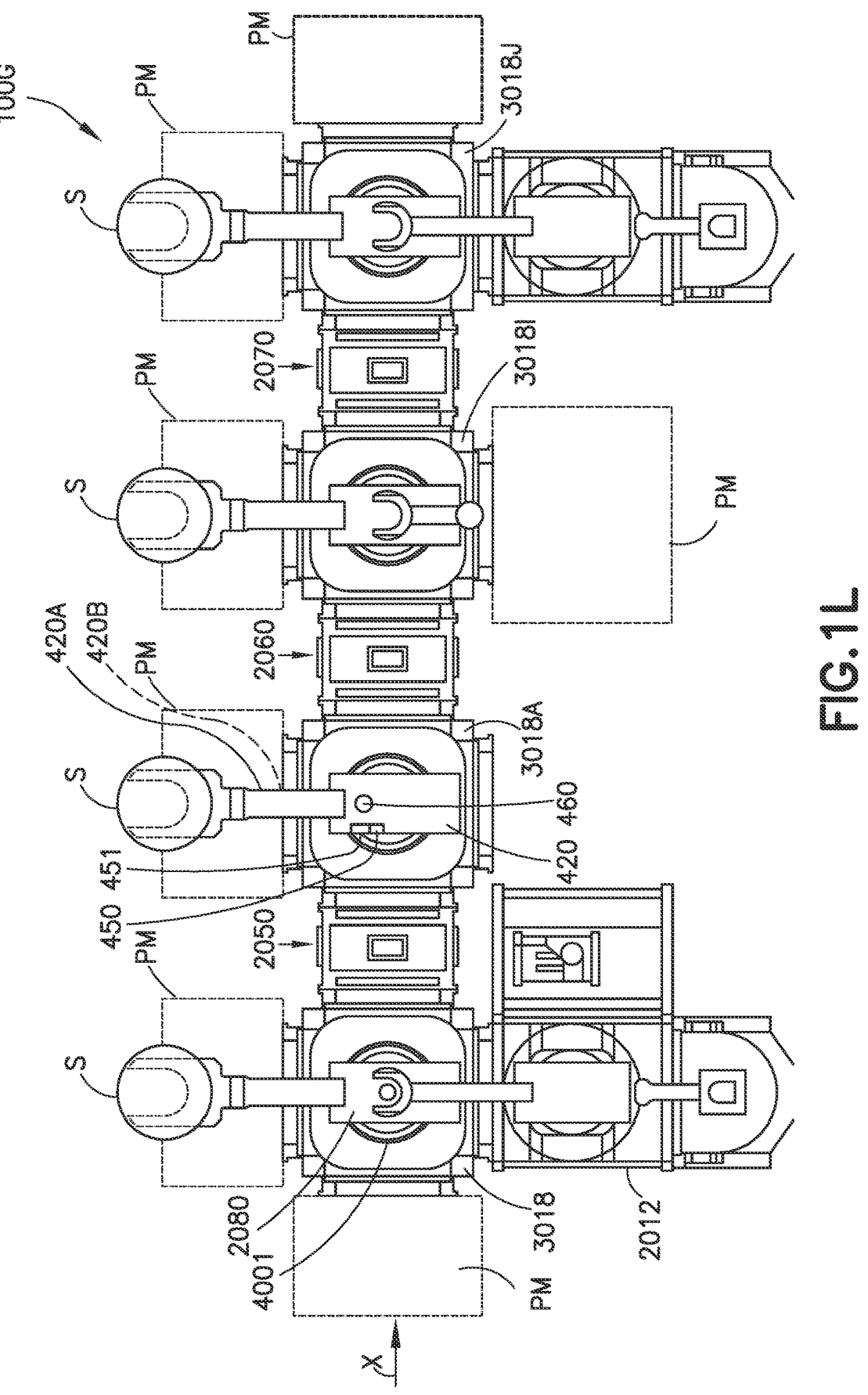

Referring now to FIG. 1L, a schematic plan view of a linear wafer processing system 100G is shown where the tool interface section 2012 is mounted to a transport chamber module 3018 so that the interface section 2012 is facing generally towards (e.g. inwards) but is offset from the longitudinal axis X of the transport chamber 3018. The transport chamber module 3018 may be extended in any suitable direction by attaching other transport chamber modules 3018A, 3018I, 3018J to interfaces 2050, 2060, 2070 as described in U.S. Pat. No. 8,398,355, previously incorporated herein by reference. Each transport chamber module 3018, 3018A, 3018I, 3018J includes any suitable wafer transport 2080, which may include one or more aspects of the disclosed embodiment described herein, for transporting wafers throughout the processing system 100G and into and out of, for example, processing modules PM. As may be realized, each chamber module may be capable of holding an isolated or controlled atmosphere (e.g. N2, clean air, vacuum).

Figure 1M:
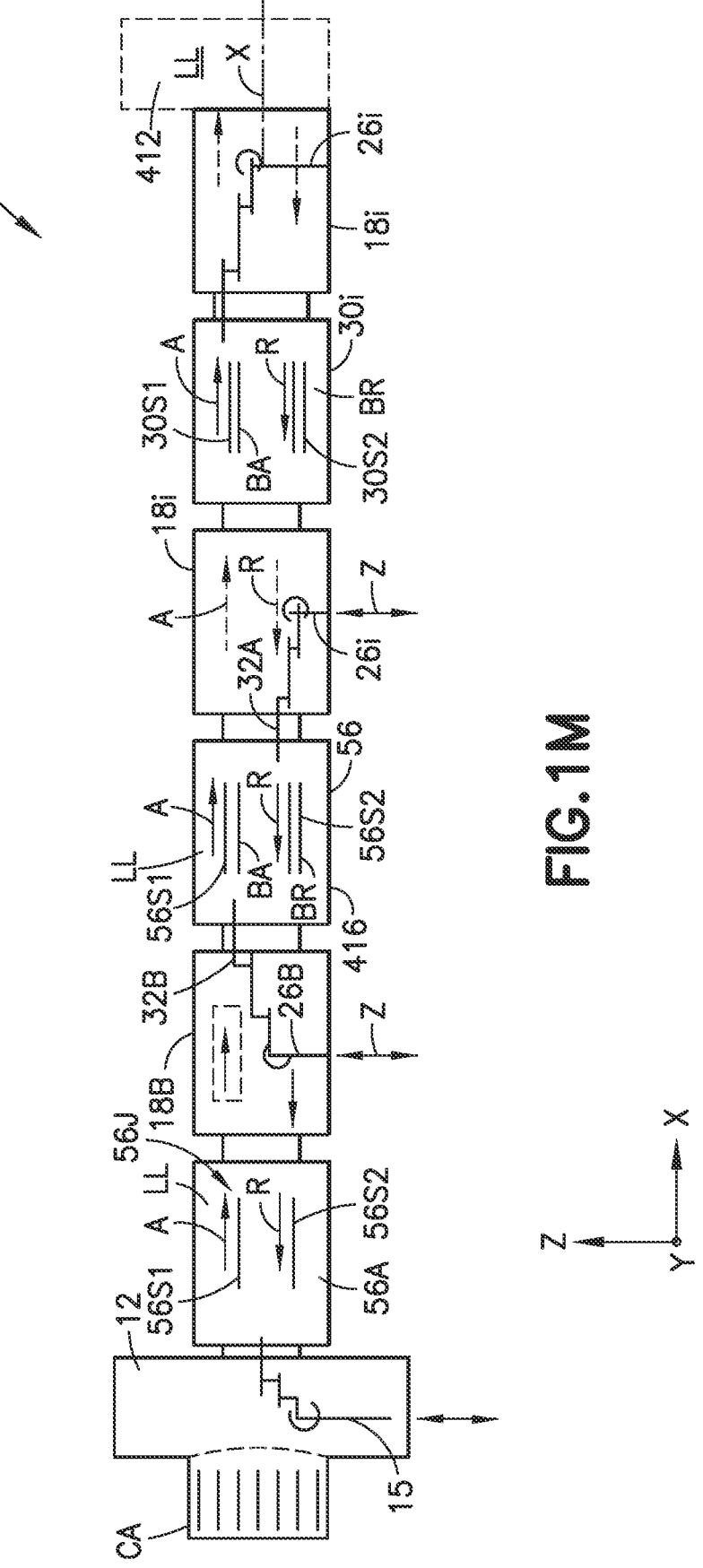

Referring to FIG. 1M, there is shown a schematic elevation view of an exemplary processing tool 100H such as may be taken along longitudinal axis X of the linear transport chamber 416. In the aspect of the disclosed embodiment shown in FIG. 1M, tool interface section 12 may be representatively connected to the transport chamber 416. In this aspect, interface section 12 may define one end of the tool transport chamber 416. As seen in FIG. 1M, the transport chamber 416 may have another workpiece entry/exit station 412 for example at an opposite end from interface station 12. In other aspects, other entry/exit stations for inserting/removing workpieces from the transport chamber may be provided. In one aspect, interface section 12 and entry/exit station 412 may allow loading and unloading of workpieces from the tool. In other aspects, workpieces may be loaded into the tool from one end and removed from the other end. In one aspect, the transport chamber 416 may have one or more transfer chamber module(s) 18B, 18I. Each chamber module may be capable of holding an isolated or controlled atmosphere (e.g. N2, clean air, vacuum). As noted before, the configuration/arrangement of the transport chamber modules 18B, 18i, load lock modules 56A, 56 and workpiece stations forming the transport chamber 416 shown in FIG. 1M is merely exemplary, and in other aspects the transport chamber may have more or fewer modules disposed in any desired modular arrangement. In the aspect shown, station 412 may be a load lock. In other aspects, a load lock module may be located between the end entry/exit station (similar to station 412) or the adjoining transport chamber module (similar to module 18i) may be configured to operate as a load lock.

As also noted before, transport chamber modules 18B, 18i have one or more corresponding transport robot 26B, 26i, which may include one or more aspects of the disclosed embodiment described herein, located therein. The transport robot 26B, 26i of the respective transport chamber modules 18B, 18i may cooperate to provide the linearly distributed workpiece transport system 420 in the transport chamber. In this aspect, the transport robot 26B may have a general SCARA arm configuration (though in other aspects the transport arms may have any other desired arrangement as described below)

In the aspect of the disclosed embodiment shown in FIG. 1M, the arms and/or end effectors of the transport robot 26B may be arranged to provide what may be referred to as fast swap arrangement allowing the transport to quickly swap wafers from a pick/place location. The transport arm 26B may have any suitable drive section 200 (e.g., coaxially arranged drive shafts, side by side drive shafts, horizontally adjacent motors, vertically stacked motors, etc.—see FIG. 2), for providing each arm with any suitable number of degrees of freedom (e.g., independent rotation about shoulder and elbow joints with Z axis motion, etc.). As seen in FIG. 1M, in this aspect the modules 56A, 56, 30i may be located interstitially between transfer chamber modules 18B, 18i and define suitable processing modules, load lock(s), buffer station(s), metrology station(s) or any other desired station(s). For example the interstitial modules, such as load locks 56A, 56 and workpiece station 30i, each have stationary workpiece supports/shelves 56S, 56S1, 56S2, 30S1, 30S2 that cooperate with the transport arms to effect transport or workpieces through the length of the transport chamber along linear axis X of the transport chamber. By way of example, workpiece(s) may be loaded into the transport chamber 416 by interface section 12. The workpiece(s) may be positioned on the support(s) of load lock module 56A with the transport arm 15 of the interface section. The workpiece(s), in load lock module 56A, may be moved between load lock module 56A and load lock module 56 by the transport arm 26B in module 18B, and in a similar and consecutive manner between load lock 56 and workpiece station 30i with arm 26i (in module 18i) and between station 30i and station 412 with arm 26i in module 18i. This process may be reversed in whole or in part to move the workpiece(s) in the opposite direction. Thus, in one aspect, workpieces may be moved in any direction along axis X and to any position along the transport chamber and may be loaded to and unloaded from any desired module (processing or otherwise) communicating with the transport chamber. In other aspects, interstitial transport chamber modules with static workpiece supports or shelves may not be provided between transport chamber modules 18B, 18i. In such aspects, transport arms of adjoining transport chamber modules may pass off workpieces directly from end effector or one transport arm to end effector of another transport arm to move the workpiece through the transport chamber. The processing station modules may operate on the wafers through various deposition, etching, or other types of processes to form electrical circuitry or other desired structure on the wafers. The processing station modules are connected to the transport chamber modules to allow wafers to be passed from the transport chamber to the processing stations and vice versa. A suitable example of a processing tool with similar general features to the processing apparatus depicted in FIG. 1D is described in U.S. Pat. No. 8,398,355, previously incorporated by reference in its entirety.

Figures 3A, 3B, 3C:
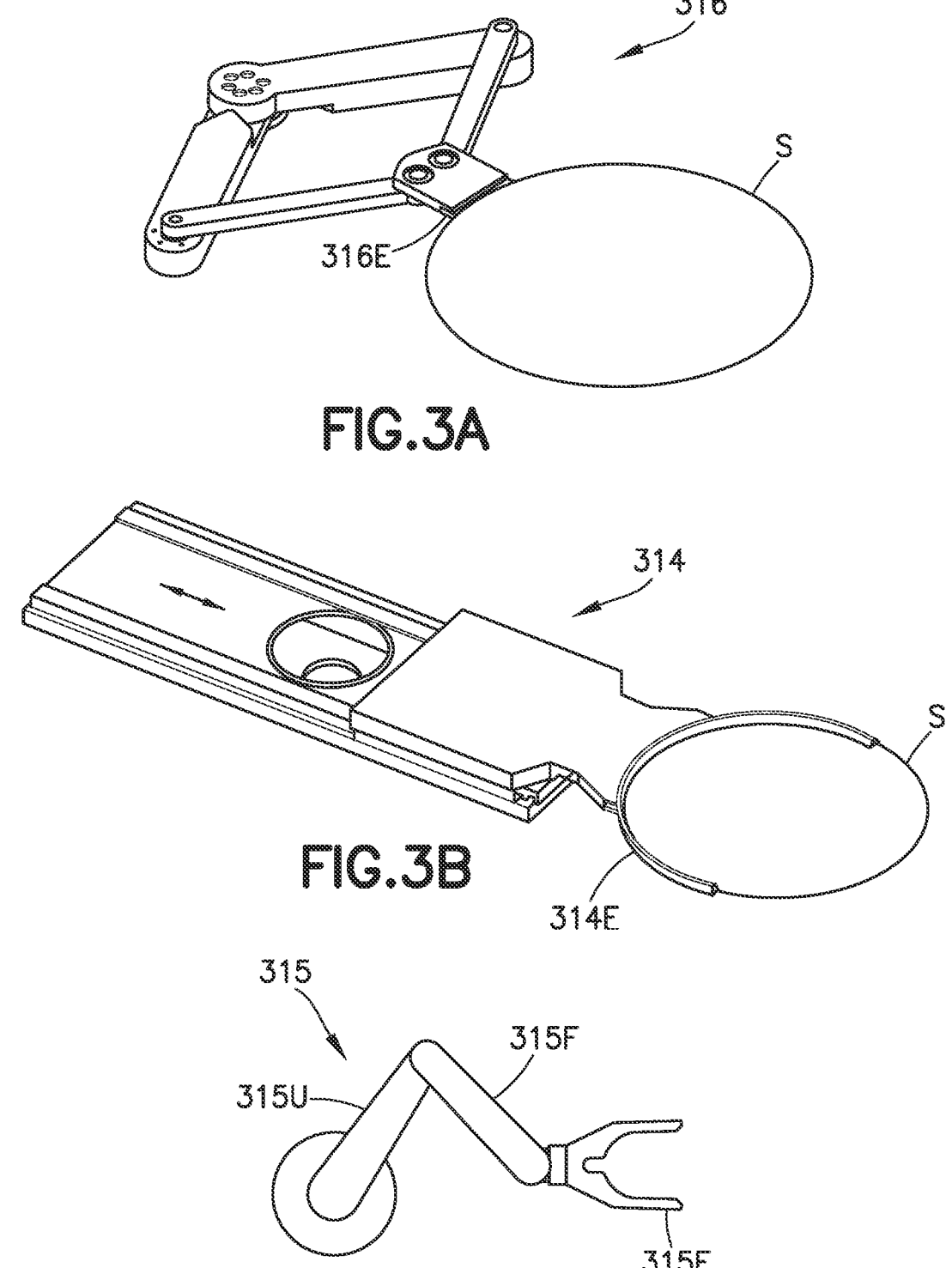
FIGS. 3A-3E are schematic illustrations of portions of the semiconductor process transport apparatus in accordance with aspects of the disclosed embodiment.
Figure 3D:
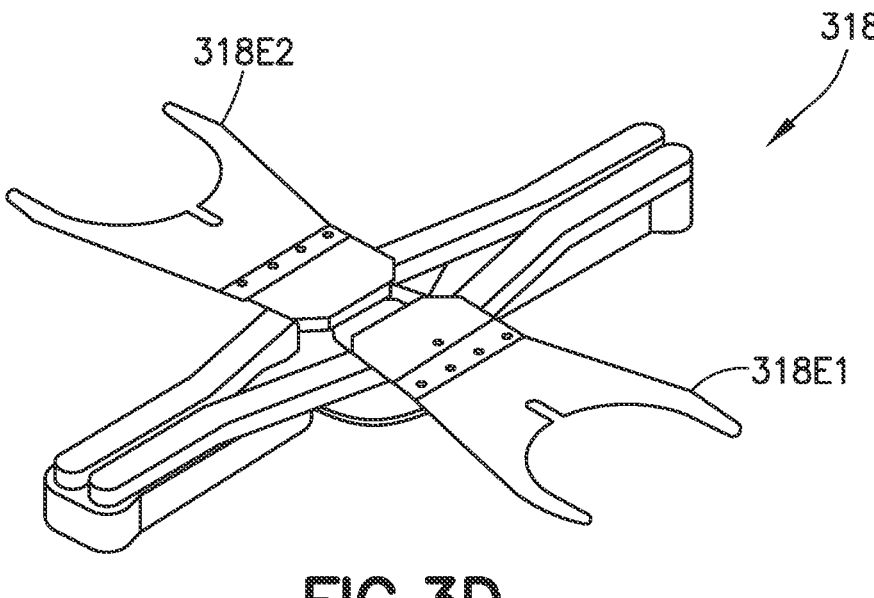
Figure 3E:
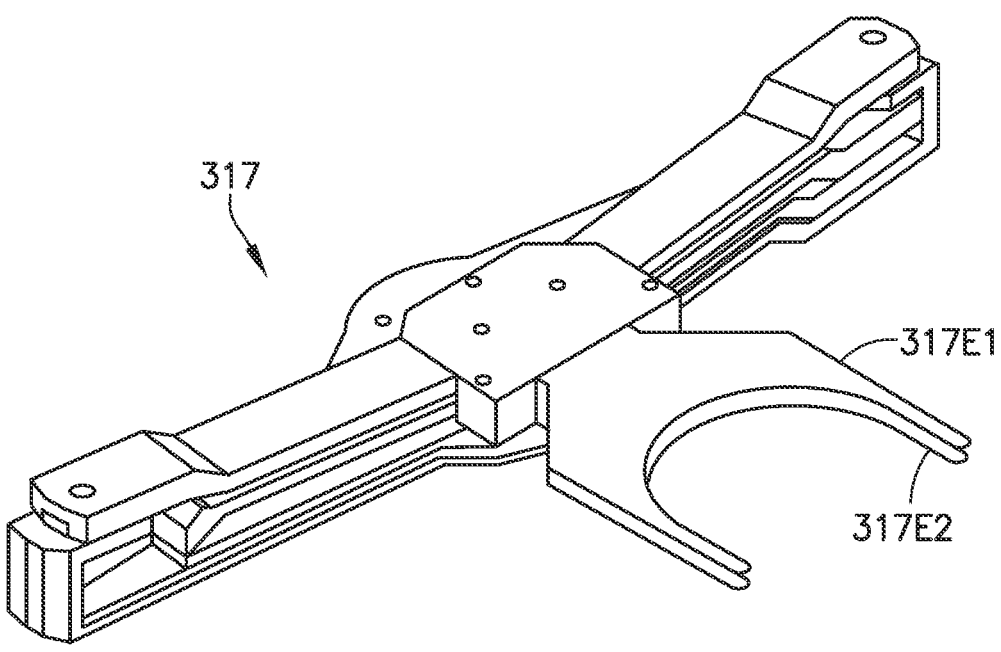

Referring now to FIGS. 2 and 3A-3E, the boom arm 143 and/or transport apparatus 104 may include any suitable arm linkage mechanism(s). Suitable examples of arm linkage mechanisms can be found in, for example, U.S. Pat. No. 7,578,649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011, U.S. Pat. No. 8,419,341 issued Apr. 16, 2013 and U.S. patent application Ser. No. 13/293,717 entitled "Dual Arm Robot" and filed on Nov. 10, 2011 and Ser. No. 13/861,693 entitled "Linear Vacuum Robot with Z Motion and Articulated Arm" and filed on Sep. 5, 2013 the disclosures of which are all incorporated by reference herein in their entireties. In aspects of the disclosed embodiment, the at least one transfer arm of each transport apparatus 104, the boom arm 143 and/or the linear slide 144 may be derived from a conventional SCARA arm 315 (selective compliant articulated robot arm) (FIG. 3C) type design, which includes an upper arm 315U, a band-driven forearm 315F and a band-constrained end-effector 315E, or from a telescoping arm or any other suitable arm design, such as a Cartesian linearly sliding arm 314 (FIG. 3B). Suitable examples of transport arms can be found in, for example, U.S. patent application Ser. No. 12/117,415 entitled "Substrate Transport Apparatus with Multiple Movable Arms Utilizing a Mechanical Switch Mechanism" filed on May 8, 2008 and U.S. Pat. No. 7,648,327 issued on January 19, 100G, the disclosures of which are incorporated by reference herein in their entireties. The operation of the transfer arms may be independent from each other (e.g. the extension/retraction of each arm is independent from other arms), may be operated through a lost motion switch or may be operably linked in any suitable way such that the arms share at least one common drive axis. In still other aspects the transport arms may have any other desired arrangement such as a frog-leg arm 316 (FIG. 3A) configuration, a leap frog arm 317 (FIG. 3E) configuration, a bi-symmetric arm 318 (FIG. 3D) configuration, etc. Suitable examples of transport arms can be found in U.S. Pat. No. 6,231,297 issued May 15, 2001, U.S. Pat. No. 5,180,276 issued Jan. 19, 1993, U.S. Pat. No. 6,464,448 issued Oct. 15, 2002, U.S. Pat. No. 6,224,319 issued May 1, 2001, U.S. Pat. No. 5,447,409 issued Sep. 5, 1995, U.S. Pat. No. 7,578,649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011 and U.S. patent application Ser. No. 13/293,717 entitled "Dual Arm Robot" and filed on Nov. 10, 2011 and Ser. No. 13/270,844 entitled "Coaxial Drive Vacuum Robot" and filed on Oct. 11, 2011 the disclosures of which are all incorporated by reference herein in their entireties. It is noted that the boom arm 143 may have a configuration substantially similar to transport arms 314, 315, 316, 317, 318 where the transport apparatus 104 is mounted to the boom arm in place of the end effector 315E, 316E, 317E1, 317E1, 318E1, 318E2.

As may be realized, the transport arm(s) 314, 315, 316, 317, 318 are operably coupled to a respective drive section 200 in any suitable manner so that the respective drive section 200 effects articulated motion of the transport arm 314, 315, 316, 317, 318 relative to a frame, such as frame 200F or any suitable frame of the processing tool 100A-100H, between a first arm position 230A (e.g., such as a retracted position of the transport arm-see FIG. 2) and a second arm position 230B or 230C (e.g., such as an extended position of the transport arm-see FIG. 2) that is different than the first arm position 230A, in a transport space TSP (see FIG. 2) defined by articulation of the transport arm 314, 315, 316, 317, 318 along at least one axis (e.g., at least one of R, θ, Z) of motion relative the frame 200F. Suitable examples of drive sections can be found in the patents and publications cited above as well as in, for example, U.S. Pat. Nos. 6,845,250; 5,899,658; 5,813,823; and 5,720,590, the disclosures of which are incorporated by reference herein in their entireties. Any suitable controller, such as controller 110, is also coupled to the drive section 200 in any suitable manner to drive the drive section 200 so as to effect the articulation of the transport arm 314, 315, 316, 317, 318.

Referring now to FIGS. 2, 4A and 4B, the adapter pendant 400 may be included with or a part of any suitable semiconductor transport apparatus 104, e.g., so as to be operably coupled for input/output I/O with the machine controller 110. In one aspect, the adapter pendant 400 may be hardwired 499 to the robot 104R (and hence the machine controller 110) in any suitable manner (e.g., such as through a universal serial bus (USB) coupling, a FireWire™ coupling, a Thunderbolt™ coupling, a serial interface (such as, e.g., RS-232), etc.), Safety over EtherCat® while in other aspects the adapter pendant may be wirelessly coupled 498 to the robot 104R (and hence the machine controller 110) in any suitable manner, through any suitable wireless communication protocol (e.g., including but not limited to Bluetooth®, Zigbee®, Z-Wave®, wireless local area networks IEEE 802.11 standards, etc.). In one aspect, the adapter pendant 400 is configured so as to be backward compatible with existing/legacy processing equipment/robots. For example, the communication protocol used between the adapter pendant 400 and, e.g., an existing/legacy robot may be a standard RS-232 communication protocol implemented through a hardwired 499 coupling, where the fungible smart mobile device SD can communicate with the existing/legacy robot using a driver and adapter module 440 integrated in the adapter pendant 400. Here, legacy commands can be supported (e.g. through the adapter pendant 400 and fungible smart mobile device SD) so that old products/equipment can also benefit from the aspects of the disclosed embodiment.

The adapter pendant 400 includes a frame 401 that forms a cradle or an otherwise universal mount 410 for any suitable fungible smart mobile device SD. The universal mount 410 may be a recess in which the fungible smart mobile device SD is inserted and retained or any suitable bracket to which the fungible smart mobile device SD is affixed. The communication interface between the fungible smart mobile device SD and the adapter pendant 400 will be described below.

Figure 5A:
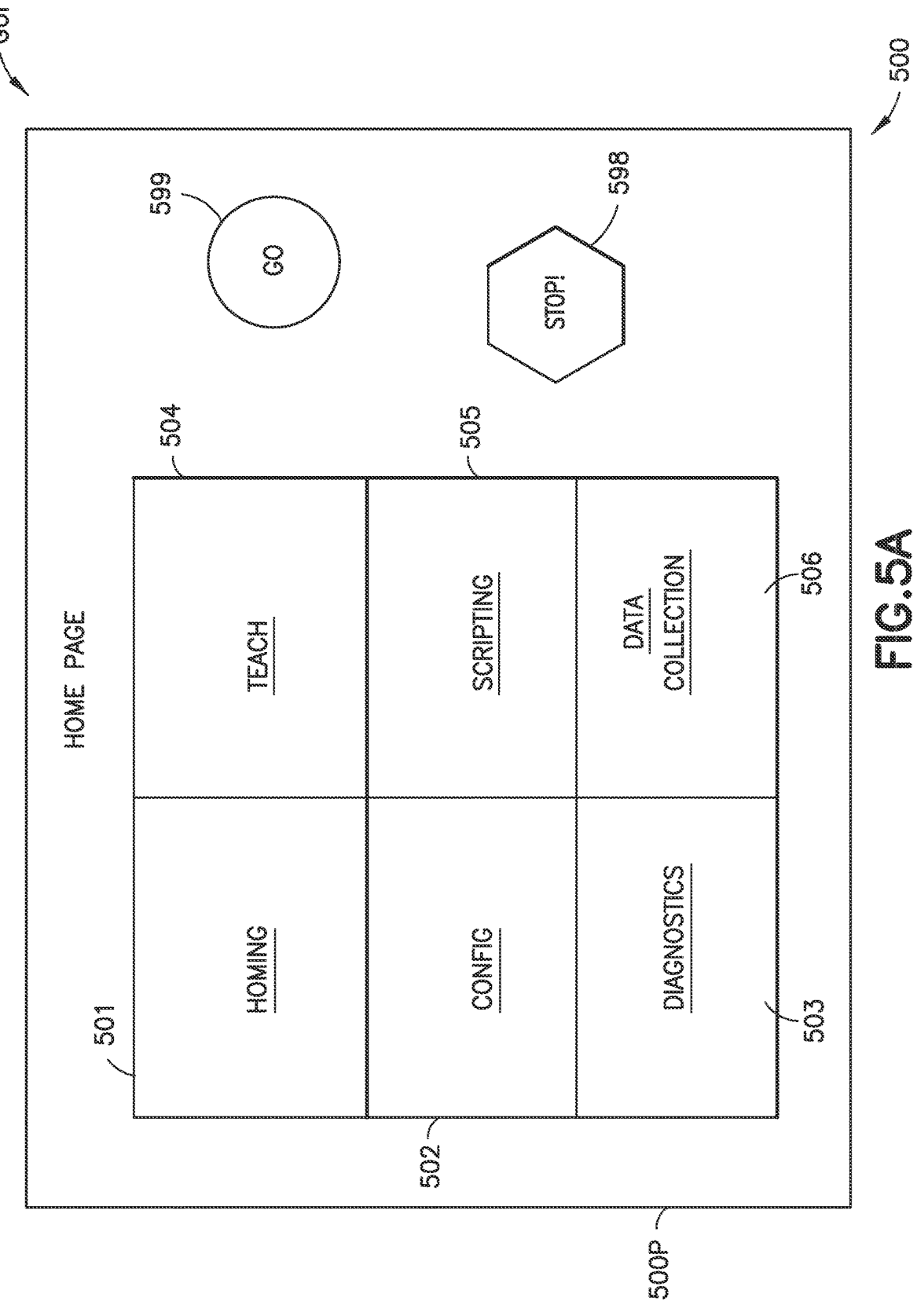
FIG. 5A is a schematic illustration of a portion of a graphical user interface on a fungible smart mobile device that is enabled by the semiconductor process transport apparatus in accordance with aspects of the disclosed embodiment.

The adapter pendant 400 may include what is generally referred to as a mode selector switch 429 (FIG. 2) configured to change an operation mode of the robot 104R and/or semiconductor process transport apparatus 104. In one aspect, the mode selector switch 429 includes one or more of a live-man switch 430, an E-stop switch 450 and an operation selection switch 460. In one aspect, the live-man switch 430, or the equivalent, is coupled to the frame 401 in any suitable manner (so as to be integral with the adapter pendant 400) and to enable robot 104R operation while using the adapter pendant 400. For example, the live-man switch 430 may be three-position live-man (or enabling) switch 430 or any other suitable functionally equivalent switch. For exemplary purposes, a three-position live-man switch is a three-position switch (OFF-ON-OFF which sequentially correspond to a first position 430P1, a second position 430P2, and a third position 430P3 of the switch) that permits robot 104R operation only when the switch is lightly pressed and held in the second position 430P2 (the "ON" or second position). The three-position live-man switch disables robot 104R operation when in the first position 430P1 and third position 430P3, such as when the switch is released (the "OFF" or first position) or when the switch is fully depressed (the "OFF" or third position). The live-man switch 430 may conform with and stop operation of the robot 104R (as described herein) in accordance with any suitable industry standards (including those described herein with respect to the E-stop switch 450) that cover the application (e.g. automated robots or other application for any industry such as semiconductor, automotive, manufacturing, assembly, etc.) in which the adapter pendant 400 is employed. In one aspect, where applicable, the live-man switch 430 may be implemented through the fungible smart mobile device SD, such as through a graphical user interface GUI presented on a display 477 of the fungible smart mobile device SD. For example, the graphical user interface GUI may include a live-man icon 599 (such as the "GO" icon in FIG. 5A) to enable robot 104R operation, where operation (e.g., in order to allow movement) of the robot 104R requires the user to maintain physical contact with the live-man icon 599 (e.g., such as with the user's finger) such that once physical contact between the user and the live-man icon 599 is broken the robot operation stops in a manner similar to that described herein with respect to the live-man switch 430. Further, touch sensitive screens (such as display 477 of fungible smart mobile devices SD enabled with pressure sensitive features (e.g., a pressure sensitive touch screen) may function to provide the OFF-ON-OFF capability of conventional three-position live-man switches so that the robot stops when the user breaks contact with the live-man icon 599 as well as when the user presses too hard on the live-man icon 599.

The adapter pendant 400 may also include one or more of an emergency stop switch, an emergency machine off switch/emergency shutoff (EMO), electronic shutoff (ESO), an emergency system off switch and/or other suitable switch (generally illustrated in FIGS. 2, 4A and 4B and referred to as E-stop switch 450) coupled to the frame 401 in any suitable manner so as to be integral with the adapter pendant 400. The E-stop switch 450 may conform to any applicable industry standards that cover the application in which the adapter pendant 400 is used (e.g. automated robots or other application for any industry such as semiconductor, automotive, manufacturing, assembly, etc.), including but not limited to the SEMI S2-93 standard; the ANSI (American National Standards Institute) B11, Electrical and Mechanical Equipment standard; Guidelines and/or ANSI/NFPA (National Fire Protection Association) 79, Electrical Standards for Industrial Machinery standard for at least Stop Category 0 (immediate removal of power to the machine or mechanical disconnection (de-clutching) of hazardous elements) and Stop Category 1 (controlled stop with power available to stop the machine followed by removal of power when stop is achieved). In one aspect, where applicable, the E-stop switch 450 may be implemented through the fungible smart mobile device SD, such as through a graphical user interface GUI of the fungible smart mobile device SD. For example, the graphical user interface GUI may include an emergency stop icon 598 (such as the "STOP!" icon in FIG. 5A) to disable robot 104R operation, such that once emergency stop icon is pressed/touched by the user, the robot operation stops in a manner similar to that described with respect to the E-stop switch 450.

The adapter pendant 400 may also include a operation selection switch 460. The operation selection 460 switch is configured to switch operating modes of, for example, the robot 104R to which the adapter pendant 400 is coupled. The operating modes of the robot 104R may include an automatic operating mode, a manual operating mode and/or a teach operating mode. In one aspect, the robot 104R operating mode selection may be effected through software of the fungible smart mobile device SD and/or through hardware of the adapter pendant 400. For example, the fungible smart mobile device SD and the adapter pendant 400 may be configured such that coupling of the fungible smart mobile device SD with the adapter pendant enables at least the manual operating mode and the teach operating mode (which modes may then be selected through the graphical user interface GUI of the fungible smart mobile device SD). In one aspect, coupling of the fungible smart mobile device SD with the adapter pendant enables the automatic operating mode, the manual operating mode and the teach operating mode (which modes may then be selected through the graphical user interface GUI of the fungible smart mobile device SD). In one aspect, removal or de-coupling of the adapter pendant 400 from the adapter pendant 400 may preclude operation of the robot 104R in the manual operating mode and the teach operating mode (e.g., the robot 104R may only operate in the automatic operating mode with the fungible smart mobile device SD removed/de-coupled from the adapter pendant 400).

In one aspect, adapter pendant 400 may include a physical mode selector switch 473 coupled to the frame 401 in any suitable manner. The mode selector switch 473 may be operably coupled to the fungible smart mobile device SD through interface 410 so that as the mode selector switch 473 is switched between the automatic, manual and teach modes the graphical user interface GUI of the fungible smart mobile device SD automatically changes, e.g. the smart device is configured to automatically, present different operating screens (such as those described below) to the user depending on the position of the mode selector switch 473.

Referring to FIGS. 2, 4A and 4B, as described above, the adapter pendant 400 is operably coupled to both the fungible smart mobile device SD and the robot 104R. In one aspect, movements of the robot 104R may be kinematically (e.g., speed, acceleration, jerk, torque, etc.) limited to be within any suitable teaching parameters when the fungible smart mobile device SD is operably coupled to the adapter pendant 400. To facilitate operably coupling both the fungible smart mobile device SD and the robot 104R the adapter pendant 400 includes a machine controller interface 405 and another interface 410. The machine controller interface 405 operably couples the adapter pendant 400 for input/output I/O with the machine controller 110 in the manner described above using a hardwired 499 or wireless 498 coupling. The other interface 410 is different from the machine controller interface 405 and is configured for operably connecting with a fungible smart fungible smart mobile device SD.

As described above, the fungible smart mobile device SD has predetermined resident user operable device functionality characteristics SDC1-SDCn resident on the fungible smart mobile device SD. The other interface 410 has a connectivity configuration 410C so that mating of the fungible smart mobile device SD with the other interface 410 automatically enables configuration of at least one of the resident user operable device functionality characteristics SDC1-SDCn of the fungible smart mobile device SD so as to define an input/output I/O to the machine controller 110 via the adapter pendant 400 effecting input commands and output signals for motion control of the articulated arm 315 of the robot 104R from the one location 230A, 230B, 230C (FIG. 2) to the other location 230A, 230B, 230C (FIG. 2). In one aspect, the other interface 410 has a connectivity configuration so that mating of the fungible smart mobile device SD with the other interface 410 effects close coupling, via the adapter pendant 400, of at least one of the user operable device functionality characteristics SDC1-SDCn of the fungible smart mobile device SD mated with the machine controller 110 so that the at least one of the user operable functionality characteristics SDC1-SDCn of the fungible smart mobile device SD, mated to the other interface SD, defines a close coupled user selectable input/output 498CC, 499CC of the semiconductor process transport apparatus 104 (see FIG. 4B). It is again noted that the close coupling 498CC, 499CC of the at least one of the user operable functionality characteristics SDC1-SDCn of the fungible smart mobile device SD has no intervening robot 104R motion command interface that intervenes (so as to reconfigure or repeat/resend input/output) between user selectable input/output, on the fungible smart mobile device SD, the motion commands/user selections (e.g. robot 104R motion commands that inform robot motion, the initial location (such as one of locations 230A-230C-FIG. 2), the other location (such as one of location 230A-230C-FIG. 2), all that are freely selectable, by the user selection on the input/output generated therefrom and the machine controller 110.

In one aspect, the connectivity configuration 410C is a plug and play connectivity configuration, and is at least one of a short or near field radio frequency coupling (as described above) and a universal serial bus port coupling (or other wired coupling as described above). In one aspect, configuration of the at least one of the resident user operable device functionality characteristics SDC1-SDCn is automatically enabled upon user initialization of the fungible smart mobile device SD mated to the adapter pendant 400. For example, in one aspect, the graphical user interface GUI for interfacing with the robot 104R (and hence the machine controller 110) is automatically "launched" or initialized and is visually presented on the fungible smart mobile device SD (e.g., is opened to allow the user to control the articulated arm 315 of the robot 104R); while in other aspects, the user may have to actively select the at least one of the resident user operable device functionality characteristics SDC1-SDCn for interfacing with the controller 110 and the robot 104R and so that the graphical user interface GUI is presented on the fungible smart mobile device SD.

In one aspect, the connectivity configuration 410C of the other interface 410 is disposed so that mating of the fungible smart mobile device SD with the other interface 410 initializes a lockout (or limited access/functionality) of at least another predetermined resident user operable functionality characteristic SDCL on the fungible smart mobile device SD. It is noted that the at least another predetermined resident user operable functionality characteristic SDCL may be one or more of the predetermined resident user operable functionality characteristic SDC1-SDCn. Here the fungible smart mobile device SD may have an unrestricted operation mode (such as when the fungible smart mobile device SD is not logged in to, e.g., the machine controller 110 and/or coupled to the adapter pendant 400) and a restricted operation mode (such as when the fungible smart mobile device SD is logged in to, e.g., the machine controller 110 and/or coupled to the adapter pendant 400). When in the restricted mode of operation, the fungible smart mobile device SD may have one or more functionalities SDC1-SDCn disabled and unavailable when compared to the unrestricted mode of operation. For example, in one aspect, the machine controller 110 may be configured to remotely manage and control the user operable device functionality characteristics SDCL, SDC1-SDCn of the fungible smart mobile device SD according to any suitable predetermined system of rules or criteria that may prevent and/or allow access to one or more of the predetermined resident user operable functionality characteristic SDC1-SDCn. In one aspect, the machine controller 110 may be configured to allow access to the graphical user interface GUI (see FIGS. 4B and 5A-5I) for controlling the transport robot 104 and limit one or more of the other predetermined resident user operable functionality characteristic SDC1-SDCn that may be in communication with the machine controller 110.

For example, when the fungible smart mobile device SD is coupled to the adapter pendant 400 control access to the transport robot 104 through the fungible smart mobile device SD may be restricted through a "login" feature of the user operable device functionality characteristics SDCL (e.g. the fungible smart mobile device SD transitions between the unrestricted operating mode and the restricted operating mode with the login feature). In other aspects, the user operable device functionality characteristics SDCL for controlling the transport robot 104 may be restricted (e.g., inaccessible) unless the fungible smart mobile device SD is connected to the adapter pendant 400. In still other aspects, a user of the fungible smart mobile device SD may be required to "login" to the user operable device functionality characteristics SDC1-SDCn for controlling the transport robot 104 prior to entering a fabrication facility (FAB) in which the transport robot 104 is located; at which login time, one or more user operable device functionality characteristics SDC1-SDCn (e.g., video recorder, audio recorder, sensor, etc., data with the fungible smart mobile device SD may be restricted) of the fungible smart mobile device SD are locked and are inaccessible while the fungible smart mobile device SD is located within the FAB, where upon mating fungible smart mobile device SD to the adapter pendant 400 at least the graphical user interface GUI (see FIGS. 4B-5I) becomes accessible for controlling the transport robot 104. Upon connection to the adapter pendant 400, limited access to data recording may also be provided such as the use of the camera for teaching the transport robot 104 substrate holding station locations 230B, 230C (see FIG. 2), accelerometer data for vibrational analysis may be available, etc.

Computer network and/or Internet access of the fungible smart mobile device SD may also be restricted. For example, when the fungible smart mobile device SD is coupled to the adapter pendant 400 Internet access to only predetermined webpages may be provided (e.g., such as equipment manufacturer websites for downloading firmware updates and online troubleshooting). As another example, access to a FAB computer network may be restricted to predetermined areas (e.g., to predetermined servers/files) of the FAB computer network by the machine controller 110 and/or through any suitable "login" of the user operable device functionality characteristics SDCL for controlling the transport robot 104.

In one aspect, the machine controller 110 includes a login database 110DB (see FIGS. 2 and 4B) that includes information pertaining to user logins, personalized settings and data, and any other suitable credential information. The login database 110DB may be part of an automated login system where the machine controller 110 detects coupling of the fungible smart mobile device SD the with adapter pendant 400, automatically retrieves predetermined credentials from the fungible smart mobile device SD and provides the fungible smart mobile device SD with predetermined functionalities (such as access to the graphical user interface GUI for controlling the transport robot 104) according to the credentials, while limiting other operable device functionality characteristics (e.g., such as restricting Internet access to predetermined webpages, restricting data recording, limiting camera use, restricting text (SMS) messaging, etc.). In one aspect, telephony functionalities of the fungible smart mobile device SD may remain active so that the user or other personnel has telephone access to, e.g., equipment manufacturer technical service. In other aspects, telephony functionalities of the fungible smart mobile device SD may be restricted to receiving incoming calls, where outgoing calls are restricted to only predetermined telephone numbers (e.g. such as equipment manufacturer technical service and other predetermined telephone numbers). In other aspects, functionality of the fungible smart mobile device SD may be restricted in any suitable manner through hardware (such as the adapter pendant 400 and/or controller 110C) and/or software (such as an application resident on the fungible smart mobile device SD) to, for example, prevent unwanted data capture and/or machine tampering with the fungible smart mobile device SD while in the fabrication facility in which the transport robot 104 is installed.

As described above, the other interface 410 has a connectivity configuration 410C so that mating of the fungible smart mobile device other SD with the interface 410 automatically enables configuration of at least one of the resident user operable device functionality characteristics SDC1-SDCn of the fungible smart mobile device SD so as to define an input/output I/O to the machine controller 110. The input/output I/O defined by the at least one of the resident user operable device functionality characteristics SDC1-SDCn has an arrangement that embodies a motion teaching control (see FIGS. 5A-5I) for effecting teaching the machine controller 110 motion control of the articulated arm 315 of the robot 104R from the one location 230A, 230B, 230C (FIG. 2) to the other location 230A, 230B, 230C (FIG. 2). For example, the resident user operable device functionality characteristics SDC1-SDCn includes the graphical user interface GUI of the fungible smart mobile device SD that is configured to define a motion teaching control input/output interface 500 for effecting teaching the machine controller 110 motion control of the articulated arm 315 from the one location 230A, 230B, 230C (FIG. 2) to the other location 230A, 230B, 230C (FIG. 2). The input/output interface 500 is illustrated on the fungible smart mobile device SD in FIG. 4B for exemplary purposes.

Referring now to FIGS. 5A-5I an exemplary graphical user interface GUI of the fungible smart mobile device SD that is configured to define the motion teaching control input/output interface 500 will be described. In one aspect, the motion teaching control input/output interface 500 includes a home page or home screen 500P. In a manner described above, the home page 500P may be presented on the graphical user interface GUI automatically upon user initialization of the fungible smart mobile device SD mated to the adapter pendant 400, while in other aspects the motion teaching control input/output interface 500 may be manually selected from the graphical user interface GUI so that the home page 500P is presented. The home page 500P may include links to other "pages" of the motion teaching control input/output interface 500 that allow a user to control the articulated arm 315 of the robot 104R in various ways. For example, the home page 500P may include links or icons 501-506, which when activated through, for example, touching the corresponding icon on the graphical user interface GUI, open a respective page of the motion teaching control input/output interface 500. For example, the home page 500P may include a homing icon 501, a configuration icon 502, a diagnostics icon 503, a teaching icon 504, a scripting icon 505, a data collection icon 506 and/or any other suitable icon for directing a user to controls of the motion teaching control input/output interface 500 for interfacing with the robot 104R and controller 110 in any suitable manner. Any one or more pages of the motion teaching control input/output interface 500 may also include, where appropriate, the live-man icon 599 and the emergency stop icon 598 described above.

Figure 5B:
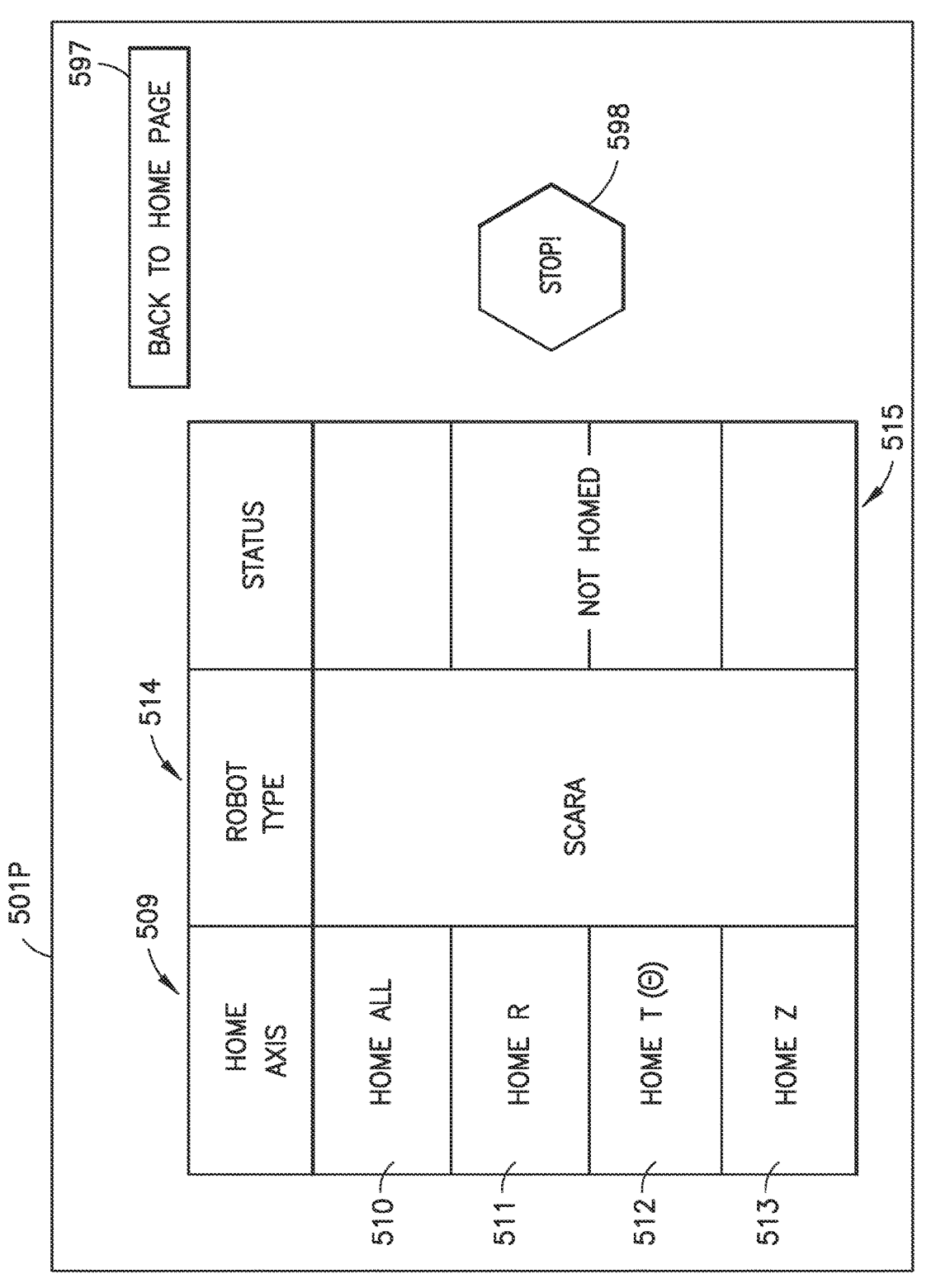
FIG. 5B is a schematic illustration of a portion of the graphical user interface of FIG. 5A in accordance with aspects of the disclosed embodiment.

FIG. 5B is an exemplary illustration of a homing page 501P which is presented on the graphical user interface GUI when the homing icon 501 is activated. The homing page 501P may include any suitable functions for moving the articulated arm 315 of the robot 104R to a predetermined calibrated home position of the articulated arm 315 (e.g., such as where the end effector 315E is moved to a position corresponding to a 0° orientation along the rotation axis θ, a 0 (zero) position along the extension axis R, and where equipped a height of 0 (zero) along the Z axis—where the home position is based position from which all movements of the articulated arm 315 are measured). For example, the homing page 501P may include a home axis 509 category of functions 510-513. These functions 510-513 may include one or more of a home all function 510 which returns all of the R, θ, Z axes to their home position; a home R function 511 which returns the extension axis R to its home position; a home T function 512 which returns the rotation axis θ to its home position; and a home Z function 513 which returns the Z axis to its home position. The homing page 501 may also include (as obtained from the controller 110) information pertaining to the operation of the robot 104R, such as a robot type 514 and a homed status 515 of each of the axes R, θ, Z. In one aspect, the home page 500P (or at least the home page icons) may always be present on the graphical user interface (see FIGS. 5D and 5E) so that the user may easily switch between the different pages 502P, 503P, 504P, 505P, 506P (corresponding to the icons 502-506) of the motion teaching control input/output interface 500 in a single selection step. In other aspects, each of the pages 502P, 503P, 504P, 505P, 506P corresponding to icons 502-506 may include a "back to home page" icon 597 which re-presents the home page 500P on the graphical user interface GUI for switching between the different pages 502P, 503P, 504P, 505P, 506P corresponding to icons 502-506.

Figure 5C:
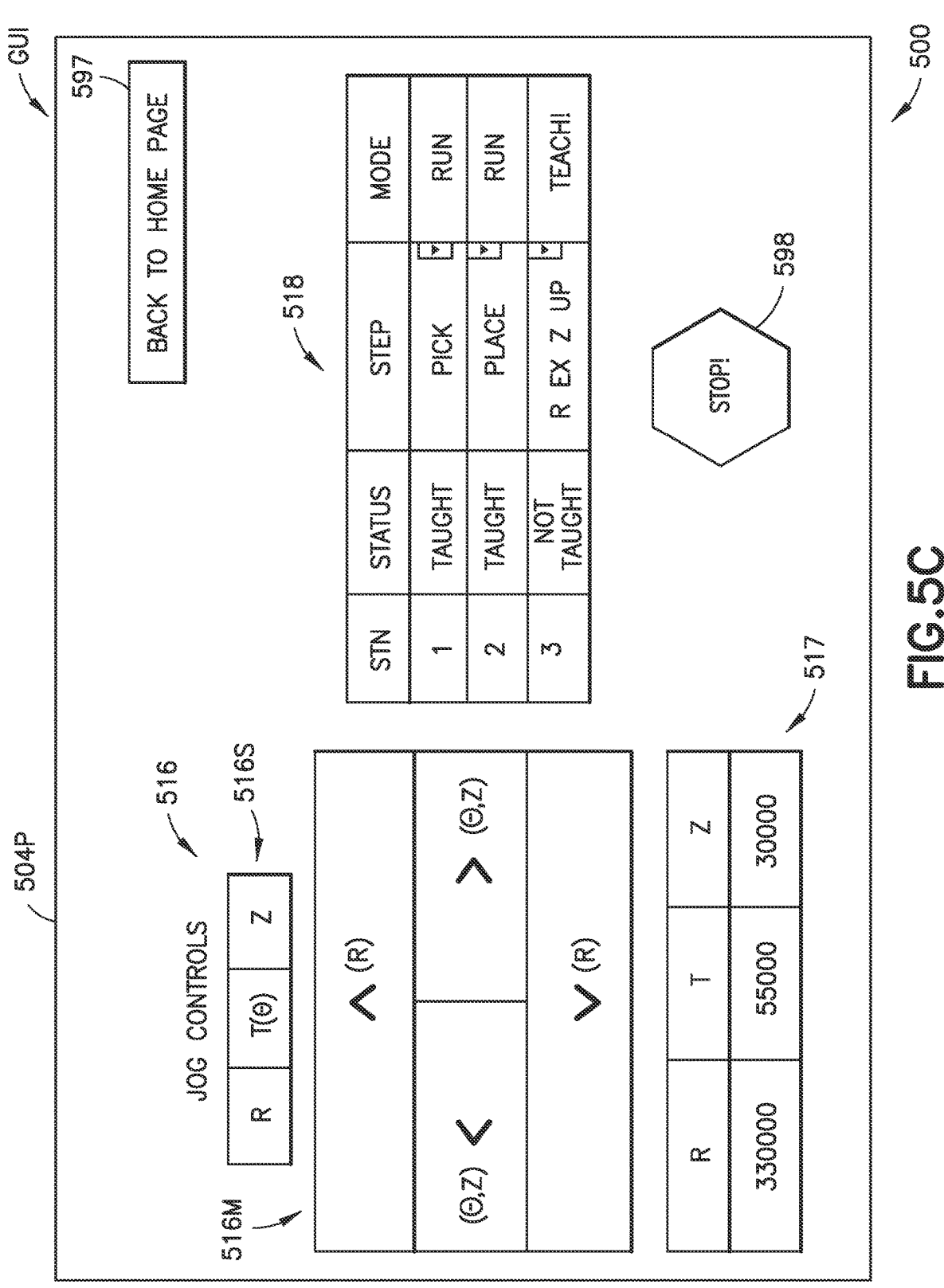
FIG. 5C is a schematic illustration of a portion of the graphical user interface of FIG. 5A in accordance with aspects of the disclosed embodiment.

FIG. 5C is an exemplary illustration of a teach page 504P which is presented on the graphical user interface GUI (which is presented on the display 477—FIG. 2—of the fungible smart mobile device SD) when the teach icon 504 is activated. Here, the display 477 is configured to graphically display at least one user selectable teaching parameter of teaching articulated arm motion of the articulated arm 315 (FIG. 2). Here the selectable teaching parameter may be any suitable teaching parameter including, but not limited to articulated arm position (R, θ, Z) 517, substrate holding station number 571, a pan number 572 of the articulated arm 315, number of slots 573 at a substrate holding station, a pitch 574 between substrate holding slots, an incremental movement step distance 575, or any other suitable teaching parameter. The teach page 504P may include any suitable functions for moving the articulated arm 315 of the robot 104R for teaching positions of station locations, such as locations 230B, 230C to the robot 104 and robot controller 110. The teach page 504P may include one or more of jog controls 516 for manually moving the articulated arm 315, a positon indicator 517 for displaying a position of the articulated arm, and station teach status information 518. The jog controls 516 may include icons 516S for selecting an axis R, θ, Z to be manually moved. The jog controls 516 may also include toggle icons 516M for moving the articulated arm 315 along the selected axis R, θ, Z. The position indicator 517 may indicate the position of the articulate arm 315 as the arm is moved using the toggle icons 516M. The station teach status information 518 may identify the substrate holding station (STN such as positions 230B, 230C), provide an indication (STATUS) of whether a particular robot move (STEP-such as a pick move, a place move and/or an extension move along a particular axis) for the station has been taught, and an operational mode of the robot move for the identified substrate holding stations (STN).

Figure 5D:
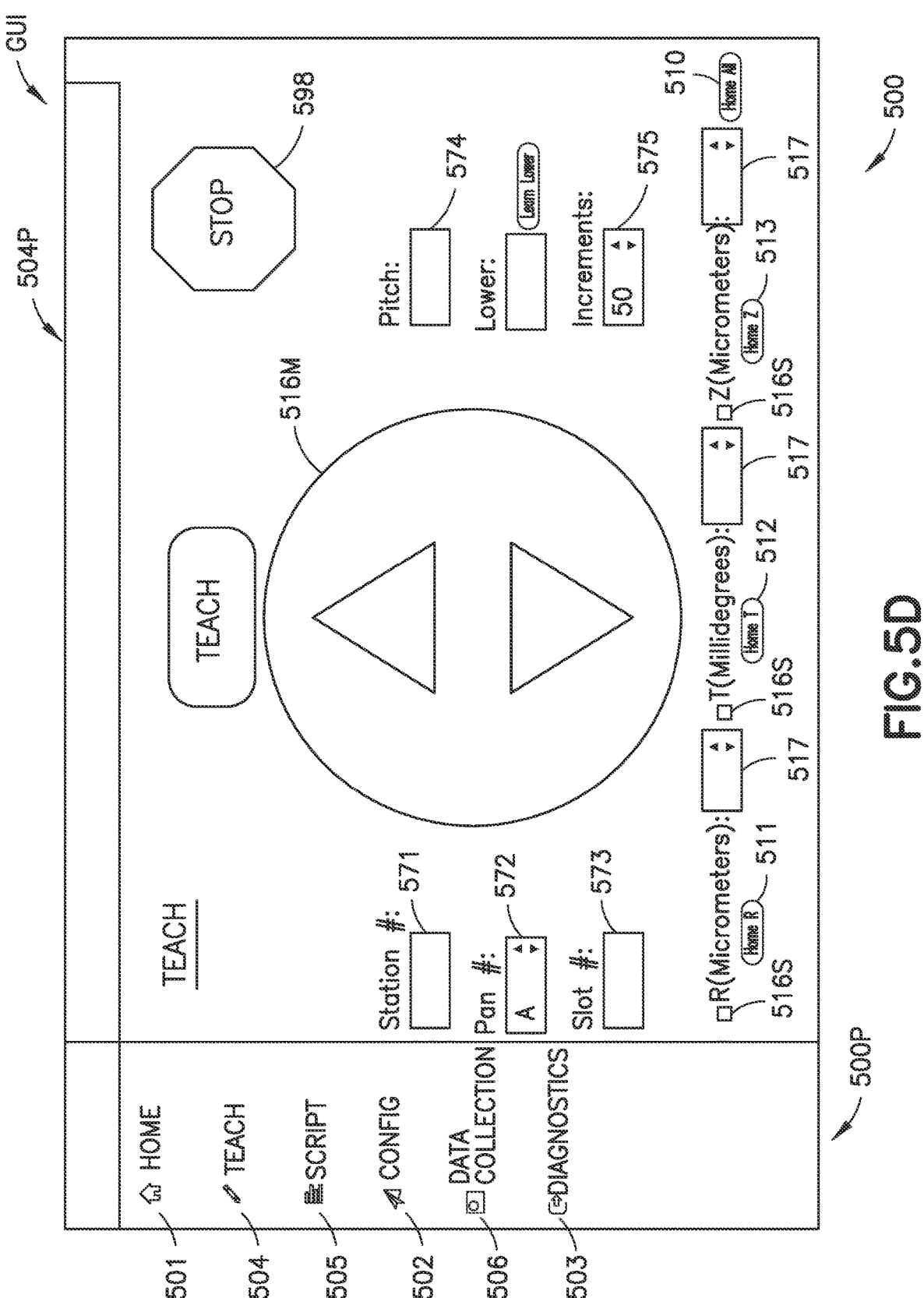
FIG. 5D is a schematic illustration of a portion of the graphical user interface of FIG. 5A in accordance with aspects of the disclosed embodiment.
Figure 5E:
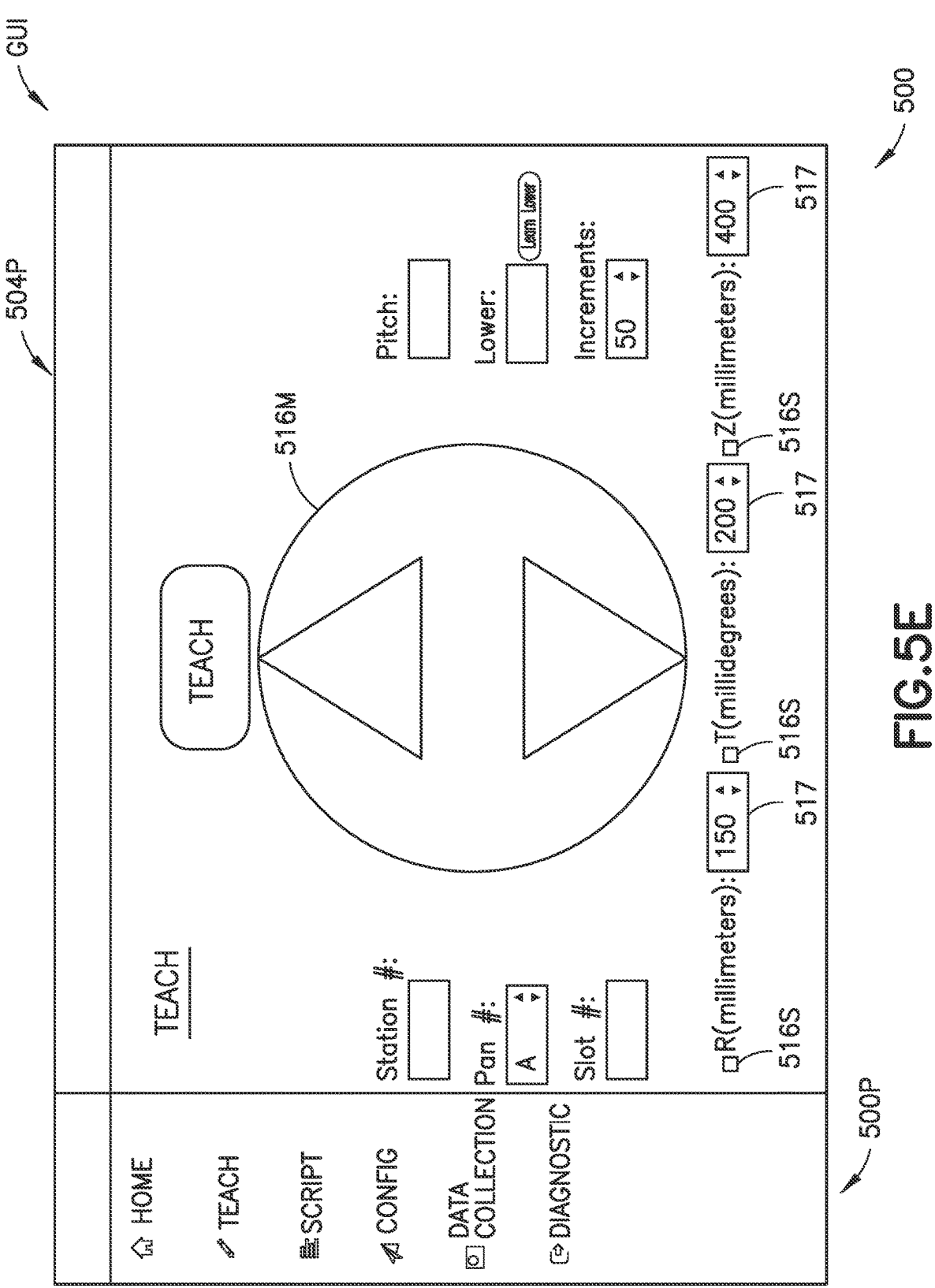
FIG. 5E is a schematic illustration of a portion of the graphical user interface of FIG. 5A in accordance with aspects of the disclosed embodiment.

FIG. 5D is an exemplary illustration of a teach page 504P in which the home page 500P is always present on the GUI and where the functionality of the homing page 501P is included/combined with the functionality of the teach page 504P. FIG. 5E is another exemplary illustration of a teach page 504P in which the homing page 500P is always present on the GUI. However, the teach page 504P of FIG. 5E lacks the functionality of the homing page 501P.

Figure 5F:
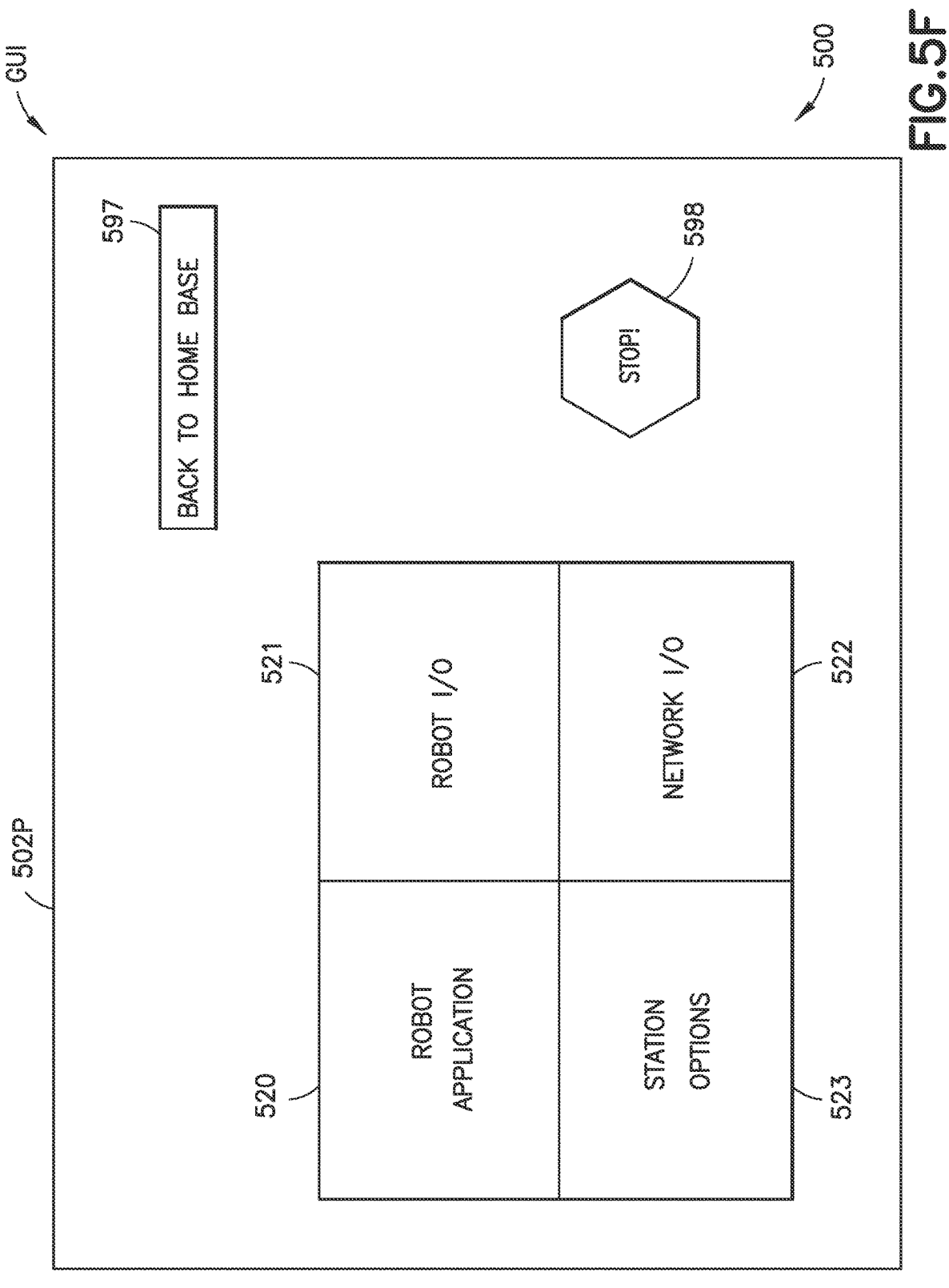
FIG. 5F is a schematic illustration of a portion of the graphical user interface of FIG. 5A in accordance with aspects of the disclosed embodiment.

FIG. 5F is an exemplary illustration of a configuration page 502P which is presented on the graphical user interface GUI when the configuration icon 502 is activated. The configuration page 502P may include any suitable functions for configuring one or more of communication between the fungible smart mobile device SD and the robot 104R/ controller 110 (see robot I/O icon 512); network communications (see network I/O icon 522); robot applications (see robot application icon 520); and station options (see station options icon 523). The robot I/O icon 521 may allow a user to configure the communication protocol used between the fungible smart mobile device SD and the robot 104R/ controller 110 in any suitable manner. The network I/O icon 522 may allow a user to configure any suitable network settings such as to provide the fungible smart mobile device SD access to the Internet and/or a computer network of the fabrication facility (FAB) in which the semiconductor process apparatus 104 is installed. The network configuration functionality provided by the network I/O icon may be password/key protected so that the FAB owner (as opposed to a regular user of the adapter pendant 400) may limit Internet access to predetermined Web pages or limit computer network access to predetermined information on the computer network. The robot application icon 520 may provide functionality to select a number of motors 200M1, 200M2 the drive section 200 of the robot 104R includes, the number of arm links, the type of end effector 315E, and/or any other suitable configurable options of the robot 104R. The station option icon 523 may provide functionality to set the number of substrate holding stations, the type of substrate holding station (e.g., cassette, aligner, process station, etc.), a number of substrate holding slots at the substrate holding station, and/or any other suitable option that may be present at the substrate holding station(s). It is noted that the settings/configurations entered on the configuration page 502P may affect which icons appear on other pages. For example, where it is specified on the configuration page 502P that the robot 104R includes the extension axis R and rotation axis θ, but does not include the Z axis, the homing page 501P (and/or other pages such as the teaching page 504P) may not include icons pertaining to the Z axis.

Figure 5G:
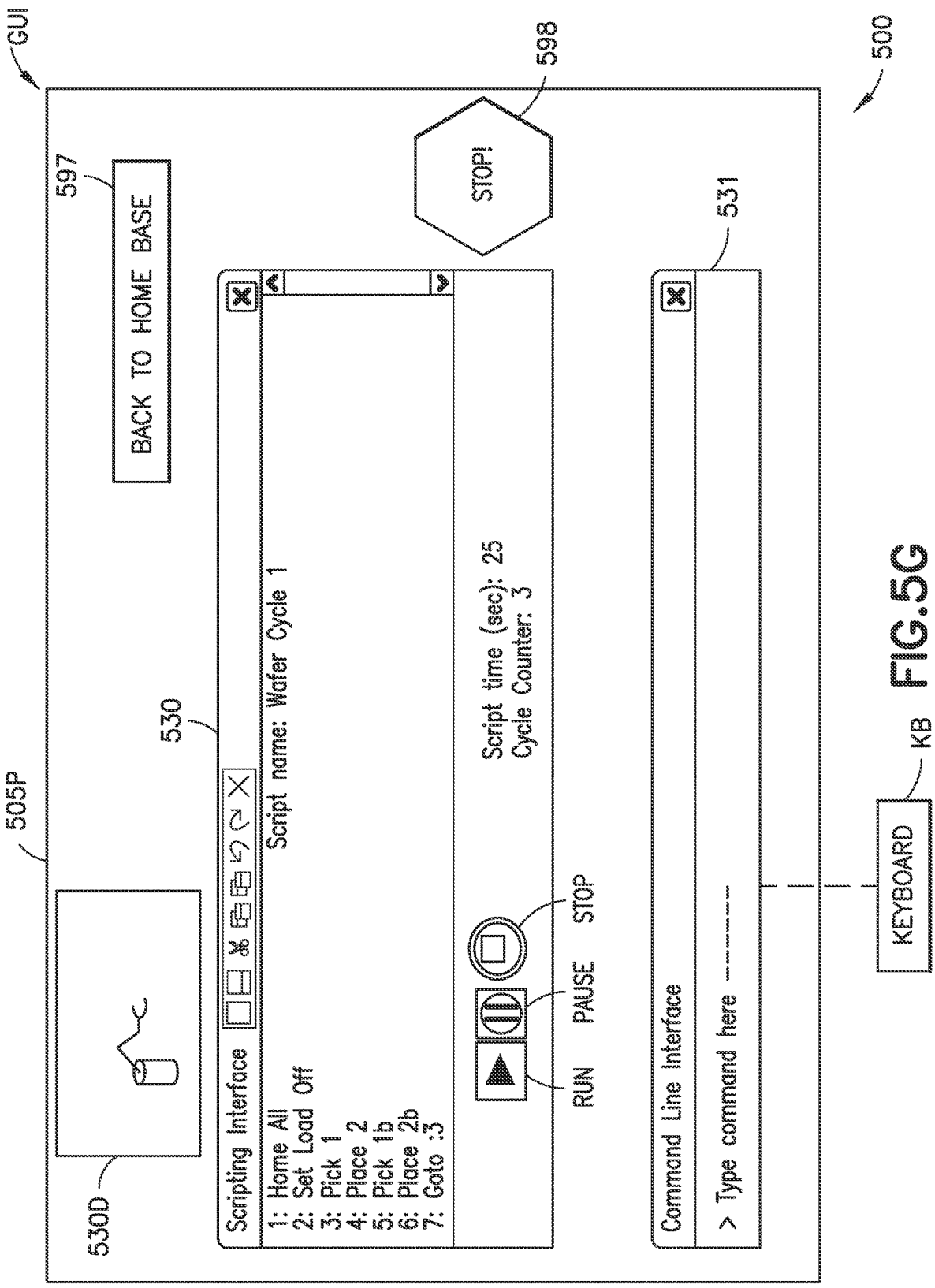
FIG. 5G is a schematic illustration of a portion of the graphical user interface of FIG. 5A in accordance with aspects of the disclosed embodiment.

FIG. 5G is an exemplary illustration of a scripting page 505P which is presented on the graphical user interface GUI when the scripting icon 505 is activated. The scripting page 505P may include any suitable functions for creating new or modifying existing scripts of robot 104R function. For example, the scripting page 505P may include a scripting interface 530 that presents to the user a script of robot 104R operations. The scripting interface 530 may include functionality (see the run, pause and stop icons) for running, pausing and/or stopping the script. The scripting page 505P may also include a command line interface 531 which when selected by the user would present an alpha-numeric keyboard KB of the fungible smart mobile device SD on the graphical user interface GUI to allow the user to enter new script or modify the script presented in the scripting interface 530. The user operable device functionality characteristics SDC1-SDCn of the fungible smart mobile device SD may also provide for robot 104R animation capabilities. For example, the scripting page 505P may include a display area 530D that is configured to present animations of the robot 104R that correspond, to for example, the script entered in the scripting interface 530.

Figure 5H:
FIG. 5H is a schematic illustration of a portion of the graphical user interface of FIG. 5A in accordance with aspects of the disclosed embodiment.
Figure 51:
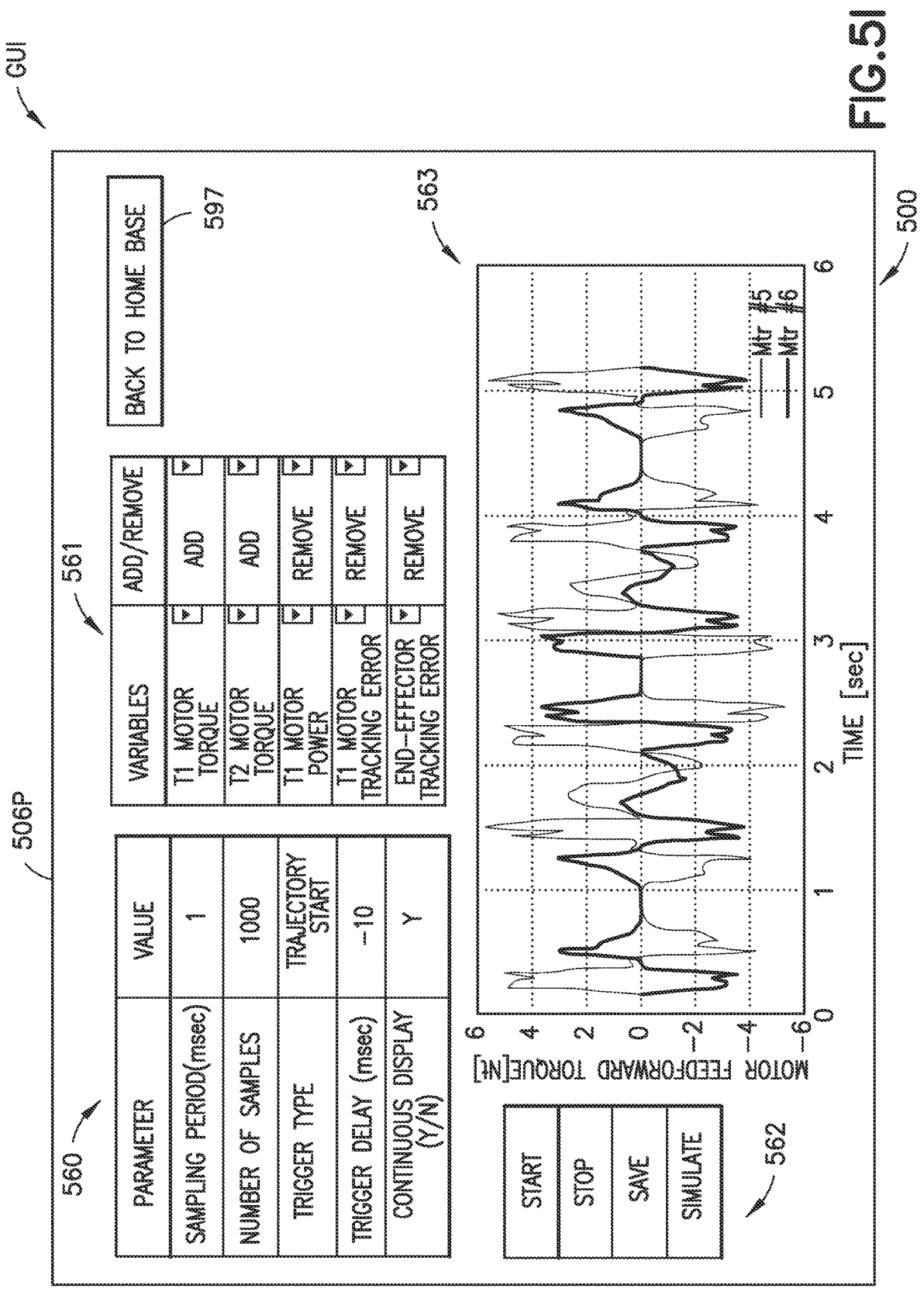

FIG. 5H is an exemplary illustration of a diagnostics page 503P which is presented on the graphical user interface GUI when the diagnostics icon 503 is activated. The diagnostics page 503P may include any suitable functions for indicating to a user, through the graphical user interface GUI, an operational status of any suitable components of the semiconductor process transport apparatus 104. For example, there may be status indicators 540 for motor operation, encoder operation, processor (of controller 110) utilization, network utilization, vibration levels, and energy consumption. There may also be a color coded legend 550 presented on the diagnostics page 503P that color coordinates operational status. For example, the color green may indicate normal operation, the color yellow may indicate a warning status, and the color red may indicate a failure of the component being monitored. Each status indicator 540 may change color to indicate the operating condition of the respective component(s) (e.g., motor(s), encoder(s), processor(s), etc.) being monitored.

FIG. 5I is an exemplary illustration of a data collection page 506P which is presented on the graphical user interface GUI when the data collection icon 506 is activated. The data collection page 506P may include any suitable functions for collecting and viewing data for any suitable component of the semiconductor process transport apparatus 104. For example, the data collection page 506P may include parameter settings 560 that are configured to allow a user to set sampling periods, a number of samples, trigger types (e.g., when sampling begins), a trigger delay, whether or not sampled data is to presented continuously on the display 563, or any other suitable data gathering parameters. Here the display 563 (which may be all or a portion of the display 477 of the fungible smart mobile device SD) is configured to graphically display a time record of at least one recorded arm motion parameter (e.g., motor feedforward torque or any other suitable parameter) of the articulated motion of the articulated arm 315. The data collection page 506P may also include variable selection settings 561 that are configured to allow a user to select any suitable parameters corresponding to components being monitored for data collection. For example, the parameters may include motor torque, motor current, motor power, motor tracking errors, end effector tracking errors, etc. Control icons 562 are also provided on the data collection page 506P and are configured for user selection to start data collection, stop data collection, save the collected data (e.g., in any suitable memory of controller 110, of the fungible smart mobile device SD, or any other suitable storage location of the FAB computer network to which the adapter pendant is coupled), or simulate data collection based on, e.g., the selected parameter settings 560 and/or variable selection settings 561. The collected data may be presented graphically, or in any other suitable manner, on display 563 of the data collection page 506P.

In one aspect, referring to FIG. 2, built-in features and/or applications SDP1-SDPn (which may be one or more of the user operable device functionality characteristics SDC1-SDCn described herein) of the fungible smart mobile device SD may be leveraged with the adapter pendant 400 to make semiconductor process tool setup more efficient and reduce machine downtime. For example, the fungible smart mobile device SD may include any suitable built in features and/or applications SDP1-SDPn which may include a level (e.g. inclination from horizontal) indicator/sensor SDP1, accelerometers SDP2, cameras SDP3, temperature sensors SDP8, wireless connectivity SDP4 Internet access SDP5, microphone(s) SDP7 and/or any other suitable software/hardware feature.

The level indicator SDP1 may be used for level measurement (e.g., a deviation from a horizontal axis) of the end effector 315E, the processing station/substrate holding station 230B, 230C and/or any other suitable feature(s) of the processing apparatus 100A, 100B, 100C, 100D, 100E, 100F, 100G, 100H. For example, the adapter pendant 400 with the fungible smart mobile device SD coupled thereto may be placed/seated on the end effector 315E (see FIG. 2) or other suitable structural features of the transport robot 104R or substrate station (the adapter pendant 400 is illustrated as being seated on a substrate station surface 230CS of substrate holding station/location 230C for exemplary purposes) for detecting a level/inclination of the transport arm 315 or substrate holding station.

In one aspect, the accelerometers SDP2 of the fungible smart mobile device SD may be used to detect, measure and/or otherwise monitor vibrations VIB produced by the transport arm 315 and/or any other suitable feature of the processing apparatus 100A, 100B, 100C, 100D, 100E, 100F, 100G, 100H. For example, the fungible smart mobile device may be wirelessly coupled to the adapter pendant 400 such that movements of the transport robot 104R may be programmed through, e.g., scripting page 505P, for delayed movement (e.g. articulated movement of the articulated arm 315 begins after a predetermined time period has elapsed) and the fungible smart mobile device SD is placed/seated on the end effector 315E (see FIG. 2) or other suitable structural features of the transport robot 104R or substrate station for detecting vibrations VIB with the accelerometer SDP2 during the delayed movement of the articulated arm 315. After the programmed articulated movement of the articulated arm 315 has stopped the fungible smart mobile device SD may be retrieved and reinserted into the adapter pendant 400. In other aspects, an external device ED1 accelerometer (see FIG. 2) may be used to detect, measure and/or otherwise monitor vibrations VIB produced by the transport arm 315 and/or any other suitable feature of the processing apparatus 100A, 100B, 100C, 100D, 100E, 100F, 100G, 100H. For example, the external device ED1 accelerometer may be wirelessly coupled to the fungible smart mobile device SD located in the adapter pendant 400 for wirelessly transmitting accelerometer data to the fungible smart mobile device.

The microphone(s) SDP7M (e.g., in conjunction with any suitable audio data recording application SDP7) may also be used to detect vibrations during, e.g., articulated arm 315 movement. It is noted that the detected vibrations VIB (either from the microphone SDP7M/audio data recording application SDP7 or accelerometer SDP2) may be displayed on the display 563 in a manner similar to that shown and described with respect to FIG. 5I.

The camera(s) of the fungible smart mobile device SD may be used (in one aspect, with limited access) for automatically teaching the transport robot 104 the locations of the substrate holding stations 230B, 230C and/or for inspection of substrates S (see, e.g., FIG. 3A).

The temperature sensor may, in one aspect, be a temperature sensor SDP8 of the fungible smart mobile device SD; or in other aspects a wireless temperature sensor (which may be one of the external devices ED1-EDn described above) such as, for example, temperature sensor ED2 (FIG. 2). The temperature sensor ED2 and/or the temperature sensor SDP8 can be read by the fungible smart mobile device SD to provide feedback for health monitoring or for thermal compensation on the robot positioning algorithms to improve accuracy and repeatability. For example, one or more arm links 315F, 315U, 315E may include a respective temperature sensor for determining thermal effects on the respective arm link 315F, 315U, 315E to effect thermal compensation; and/or one or more motors of the drive section 200 a may have a respective temperature sensor for monitoring temperature of the respective motor for detecting motor failure.

The wireless connectivity SDP4 (such as Bluetooth®, etc.) may be used to establish communication between the fungible smart mobile device SD and the adapter pendant 400.

The Internet access SDP5 of the fungible smart mobile device SD (which may be restricted in any suitable manner, as described herein) may provide for software/firmware downloads to, for example, the transport robot 104, the adapter pendant 400 or to any other suitable feature of the processing apparatus 100A, 100B, 100C, 100D, 100E, 100F, 100G, 100H. Internet access SDP5 of the fungible smart mobile device SD may also provide user access to, for example, any suitable information/documentation, from automation equipment and/or the Internet, that includes (but is not limited to) semiconductor equipment applications (such as applications SDP1-SDPn, which are installed on the fungible smart mobile device SD), product manuals, command syntax, service bulletins, firmware (or other) upgrade instructions, repair instructions, and troubleshooting guides. Internet access SDP5 (and or the wireless connectivity SDP4) may also provide for receiving with the fungible smart mobile device SD automation status email notifications from an end user's FAB computer network. The applications SDP1-SDP6 may facilitate integrated data collection and diagnostics analysis for automation machine components with the fungible smart mobile device SD by collecting any suitable data from the automation and analyzing the collected data (such as in combination with controller 110C or alone) (see the data collection page 506P in FIG. 5I and described herein).

The smart mobile devices SD also have the fungible capability of downloading, storing and running applications or programs (this functionality and associated applications/programs may also be one or more of the user operable device functionality characteristics SDC1-SDCn). The aspects of the disclosed embodiment allows for an automation supplier (such as a supplier of the transport robot 104) the flexibility to provide applications or programs for the fungible smart mobile devices SD that can be downloaded to the fungible smart mobile devices SD for use with the automation equipment (such as the transport robot 104). For example, an automation supplier may provide application SDP6 that is downloaded to the fungible smart mobile device SD. The application SDP6 may be configured to provide a single point of control for at least a portion of the processing apparatus 100A, 100B, 100C, 100D, 100E, 100F, 100G, 100H (such as transport apparatus 104). For example, the application SDP6 may be configured with the graphical user interface GUI described herein so that, upon user interaction, the transport apparatus 104 is controlled in any suitable manner.

Figure 6:
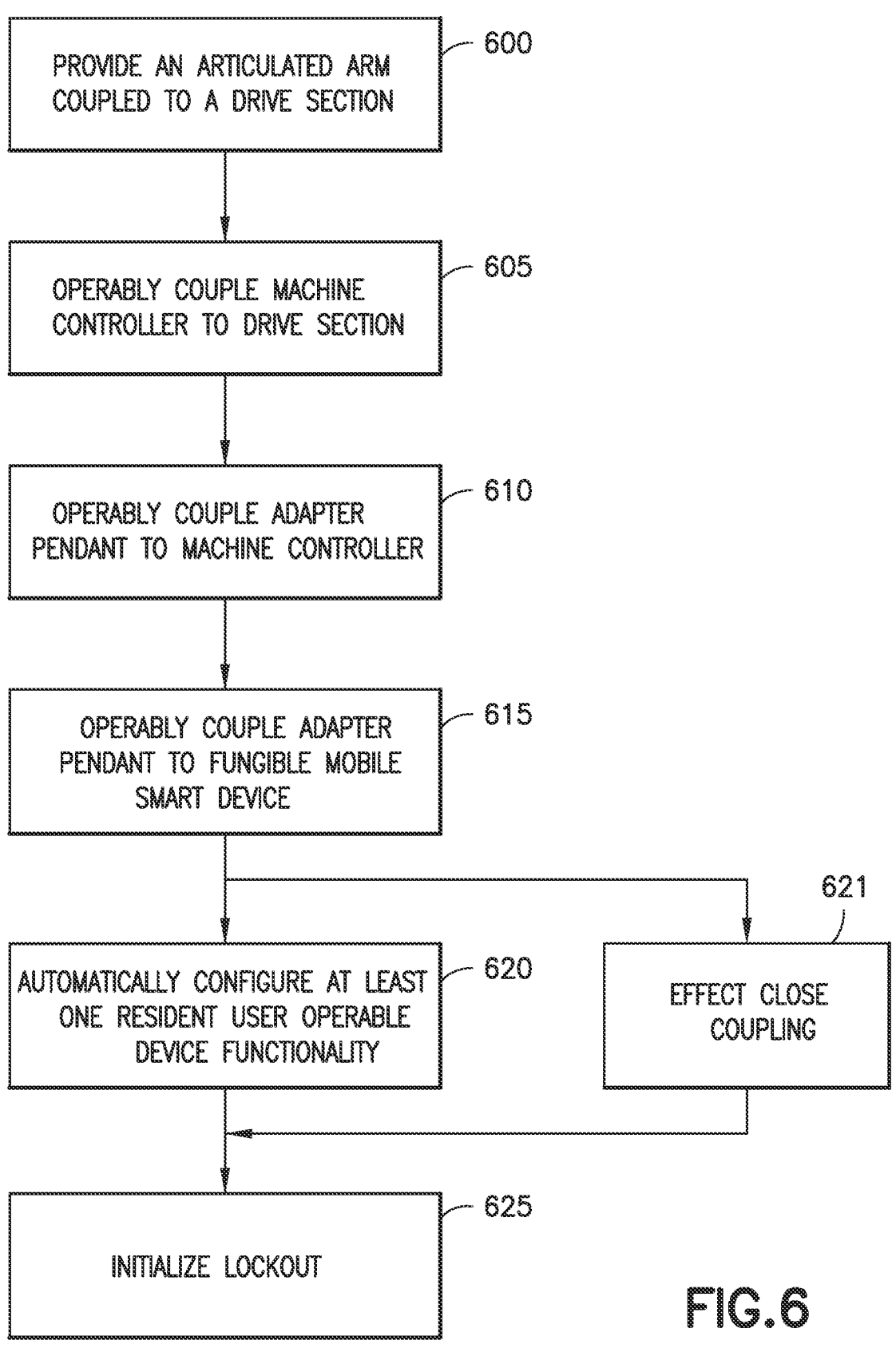
FIG. 6 is a flow diagram in accordance with aspects of the disclosed embodiment.

Referring now to FIGS. 2, 4A, 4B and 6 an exemplary operation will be described in accordance with aspects of the disclosed embodiment. For example, the operation includes providing an articulated arm 315 coupled to a drive section 200 for driving articulation motion of the articulated arm 315 (FIG. 6, Block 600). As described herein, the drive section 200 has at least one motor 200M1, 200M2. A machine controller 110 is operably coupled to the drive section 200 (FIG. 6, Block 605) so as to control the at least one motor 200M1, 200M2 for moving the articulated arm 315 from one location 230B, 230C to a different other location 230B, 230C. An adapter pendant 400 is operably coupled, for input/output, to the machine controller 110 with a machine controller interface 405 of the adapter pendant 400 (FIG. 6, Block 610). As described herein, the adapter pendant 400 has another interface 410, different from the machine controller interface 405 and configured for operably connecting with a fungible smart mobile device SD (FIG. 6, Block 615) having predetermined resident user operable device functionality characteristics SDCL, SDC1-SDCn resident on the fungible smart mobile device SD. As described herein, the other interface 410 has a connectivity configuration so that mating of the fungible smart mobile device SD enables configuration of at least one of the resident user operable device functionality characteristics SDCL, SDC1-SDCn of the fungible smart mobile device (FIG. 6, Block 620) so as to define an input/output to the machine controller via the adapter pendant effecting input commands and output signals for motion control of the articulated arm from the one location to the other location. For example, in one aspect, configuration of the at least one of the resident user operable device functionality characteristics SDCL, SDC1-SDCn is automatically enabled upon user initialization of the fungible smart mobile device SD mated to the adapter pendant 400. In one aspect, the other interface 410 has a connectivity configuration so that mating of the fungible smart mobile device SD with the other interface 410 effects close coupling, via the adapter pendant 400, of at least one of the user operable device functionality characteristics SDC1-SDCn (FIG. 6, Block 621) of the fungible smart mobile device SD mated with the machine controller 110 so that the at least one of the user operable functionality characteristics SDC1-SDCn of the fungible smart mobile device SD, mated to the other interface 410, defines a close coupled user selectable input/output 498CC, 499CC of the semiconductor process transport apparatus 104. In one aspect, the connectivity configuration of the other interface 410 is disposed so that mating of the fungible smart mobile device SD with the other interface 410 initializes a lockout (or limited access/functionality) 6, Block 625) of at least another predetermined resident user operable functionality characteristic SDCL, SDC1-SDCn on the fungible smart mobile device SD.

As described herein, the aspects of the disclosed embodiment allow an automation supplier the flexibility to provide applications for fungible smart mobile devices SD (e.g., such as smart phones and tablets) that can be downloaded to the fungible smart mobile devices SD (such as the fungible smart mobile devices carried by service personnel or other users of the automation equipment) for use with automation equipment produced/provided by the automation supplier. In accordance with the aspects of the disclosed embodiment, a user will mount a fungible smart mobile device SD to the adapter pendant 400 and establish a connection between the adapter pendant 400 and the fungible smart mobile device SD, either through a wireless connection or a wired connection. Once connection is established, the user may select an appropriate application SDP1-SDP6 (which may be one or more resident user operable functionality characteristic SDCL, SDC1-SDCn) or the appropriate application may be automatically launched/activated when the connection between the adapter pendant 400 and the fungible smart mobile device SD is established. The adapter pendant 400 and the application(s) running on the fungible smart mobile device SD provide a single point of control for the automation equipment.

As described herein the adapter pendant 400 establishes the electromechanical interface with the automation equipment, such as transport robot 104. In one aspect, the adapter pendant 400 may include any suitable mode selector switch 429 which includes one or more E-stop switches 450, live-man switches 430 and other suitable switches as described herein, while in other aspects, where appropriate, the E-stop switches 450, live-man switches 430 and other suitable switches (see FIGS. 2, 4A and 4B) may be provided by the user operable device functionality characteristics SDCL, SDC1-SDCn through the graphical user interface GUI (see FIG. 5A).

In accordance with one or more aspects of the disclosed embodiment a semiconductor process transport apparatus comprises a drive section with at least one motor;

an articulated arm coupled to the drive section for driving articulation motion of the articulated arm;

a machine controller operably coupled to the drive section so as to control the at least one motor for moving the articulated arm from one location to a different other location; and an adapter pendant having a machine controller interface operably coupling the adapter pendant for input/output with the machine controller, the adapter pendant having another interface, different from the machine controller interface and configured for operably connecting with a fungible smart mobile device having predetermined resident user operable device functionality characteristics resident on the fungible smart mobile device;

wherein other the interface has a connectivity configuration so that mating of the fungible smart mobile device with the other interface automatically enables configuration of at least one of the resident user operable device functionality characteristics of the fungible smart mobile device so as to define an input/output to the machine controller via the adapter pendant effecting input commands and output signals for motion control of the articulated arm from the one location to the other location.

In accordance with one or more aspects of the disclosed embodiment configuration of the at least one of the resident user operable device functionality characteristics is automatically enabled upon user initialization of the fungible smart mobile device mated to the adapter pendant.

In accordance with one or more aspects of the disclosed embodiment the connectivity configuration is a plug and play connectivity configuration, and is at least one of a short or near field radio frequency coupling and a universal serial bus port coupling.

In accordance with one or more aspects of the disclosed embodiment the input/output defined by the at least one of the resident user operable device functionality characteristics has an arrangement that embodies a motion teaching control for effecting teaching the machine controller motion control of the articulated arm from the one location to the other location.

In accordance with one or more aspects of the disclosed embodiment the resident user operable device functionality characteristics includes a graphical user interface of the fungible smart mobile device that is configured to define a motion teaching control input/output interface for effecting teaching the machine controller motion control of the articulated arm from the one location to the other location.

In accordance with one or more aspects of the disclosed embodiment the adapter pendant includes one or more of an integral emergency stop switch or emergency machine off switch or emergency system off switch.

In accordance with one or more aspects of the disclosed embodiment the adapter pendant has an integral live-man switch.

In accordance with one or more aspects of the disclosed embodiment the connectivity configuration of the other interface is disposed so that mating of the fungible smart mobile device with the other interface initializes a lockout (or limited access/functionality) of at least another predetermined resident user operable functionality characteristic on the fungible smart mobile device.

In accordance with one or more aspects of the disclosed embodiment at least one of the one location and the other location is a workpiece holding station in a semiconductor processing apparatus.

In accordance with one or more aspects of the disclosed embodiment the adapter pendant includes an integral mode selection switch.

In accordance with one or more aspects of the disclosed embodiment a method comprises:

providing an articulated arm coupled to a drive section for driving articulation motion of the articulated arm, the drive section having at least one motor;

operably coupling a machine controller to the drive section so as to control the at least one motor for moving the articulated arm from one location to a different other location; and operably coupling, for input/output, an adapter pendant to the machine controller with a machine controller interface of the adapter pendant, the adapter pendant having another interface, different from the machine controller interface and configured for operably connecting with a fungible smart mobile device having predetermined resident user operable device functionality characteristics resident on the fungible smart mobile device;

wherein the other interface has a connectivity configuration so that mating of the fungible smart mobile device with the other interface automatically enables configuration of at least one of the resident user operable device functionality characteristics of the fungible smart mobile device so as to define an input/output to the machine controller via the adapter pendant effecting input commands and output signals for motion control of the articulated arm from the one location to the other location.

In accordance with one or more aspects of the disclosed embodiment the method further comprises automatically enabling configuration of the at least one of the resident user operable device functionality characteristics upon user initialization of the fungible smart mobile device mated to the adapter pendant.

In accordance with one or more aspects of the disclosed embodiment the connectivity configuration is a plug and play connectivity configuration, and is at least one of a short or near field radio frequency coupling and a universal serial bus port coupling.

In accordance with one or more aspects of the disclosed embodiment the input/output defined by the at least one of the resident user operable device functionality characteristics has an arrangement that embodies a motion teaching control for effecting teaching the machine controller motion control of the articulated arm from the one location to the other location.

In accordance with one or more aspects of the disclosed embodiment the resident user operable device functionality characteristics includes a graphical user interface of the fungible smart mobile device, the method further comprising defining, with the graphical user interface, a motion teaching control input/output interface for effecting teaching the controller control machine motion of the articulated arm from the one location to the other location.

In accordance with one or more aspects of the disclosed embodiment the adapter pendant includes one or more of an integral emergency stop switch, an emergency machine off switch, and an emergency system off switch.

In accordance with one or more aspects of the disclosed embodiment the adapter pendant has an integral live-man switch.

In accordance with one or more aspects of the disclosed embodiment the connectivity configuration of the other interface is disposed so that mating of the fungible smart mobile device with the other interface initializes a lockout (or limited access/functionality) of at least another predetermined resident user operable functionality characteristic on the fungible smart mobile device.

In accordance with one or more aspects of the disclosed embodiment at least one of the one location and the other location is a workpiece holding station in a semiconductor processing apparatus.

In accordance with one or more aspects of the disclosed embodiment the adapter pendant includes an integral mode selection switch.

In accordance with one or more aspects of the disclosed embodiment a semiconductor process transport apparatus comprises:

a drive section with at least one motor;

an articulated arm coupled to the drive section for driving articulation motion of the articulated arm;

a machine controller operably coupled to the drive section so as to control the at least one motor for moving the articulated arm from one location to a different other location; and an adapter pendant having a machine controller interface operably coupling the adapter pendant for input/output with the machine controller, the adapter pendant having another interface, different from the machine controller interface and configured for operably connecting with a fungible smart mobile device having predetermined user operable device functionality characteristics resident on the fungible smart mobile device, wherein the other interface has connectivity configuration so that mating of the fungible smart mobile device with the other interface effects close coupling, via the adapter pendant, of at least one of the user operable device functionality characteristics of the fungible smart mobile device mated with the machine controller so that the at least one of the user operable functionality characteristics of the fungible smart mobile device, mated to the other interface, defines a close coupled user selectable input/output of the semiconductor process transport apparatus.

In accordance with one or more aspects of the disclosed embodiment the at least one of the user operable device functionality characteristics is a graphical user interface of the fungible smart mobile device that is close coupled via the adapter pendant with the machine controller so as to effect a close coupled user interface of the transport apparatus.

In accordance with one or more aspects of the disclosed embodiment the at least one of the user operable device functionality characteristics is at least one sensor resident on the smart device.

In accordance with one or more aspects of the disclosed embodiment the at least one of the user operable device functionality characteristics is a data logging function resident on the smart device.

In accordance with one or more aspects of the disclosed embodiment the at least one of the user operable device functionality characteristics is a graphic display function on the fungible smart mobile device configured to graphically display at least one user selectable teaching parameter of teaching articulated motion of the articulated arm.

In accordance with one or more aspects of the disclosed embodiment the at least one of the user operable device functionality characteristics is at least one of a recording function resident on the fungible smart mobile device, and at least one of a graphic display function on the fungible smart mobile device configured to graphically display a time record of at least one recorded arm motion parameter of the articulated motion of the articulated arm.

In accordance with one or more aspects of the disclosed embodiment configuration of the at least one of the user operable device functionality characteristics is automatically enabled upon user initialization of the fungible smart mobile device mated to the adapter pendant.

In accordance with one or more aspects of the disclosed embodiment the connectivity configuration is a plug and play connectivity configuration, and is at least one of a short or near field radio frequency coupling and a universal serial bus port coupling.

In accordance with one or more aspects of the disclosed embodiment the input/output defined by the at least one of the user operable device functionality characteristics has an arrangement that embodies a motion teaching control for effecting teaching the machine controller motion control of the articulated arm from the one location to the other location.

In accordance with one or more aspects of the disclosed embodiment the user operable device functionality characteristics includes a graphical user interface of the fungible smart mobile device that is configured to define a motion teaching control input/output interface for effecting teaching the machine controller motion control of the articulated arm from the one location to the other location.

In accordance with one or more aspects of the disclosed embodiment the adapter pendant includes one or more of an integral emergency stop switch, an emergency machine off switch, and an emergency system off switch.

In accordance with one or more aspects of the disclosed embodiment the adapter pendant has an integral live-man switch.

In accordance with more aspects of the one or disclosed embodiment the connectivity configuration of the other interface is disposed so that mating of the fungible smart mobile device with the other interface initializes a lockout (or limited access/functionality) of at least another predetermined user operable functionality characteristic on the fungible smart mobile device.

In accordance with one or more aspects of the disclosed embodiment at least one of the one location and the other location is a workpiece holding station in a semiconductor processing apparatus.

In accordance with one or more aspects the disclosed embodiment the adapter pendant includes an integral mode selection switch.

In accordance with one or more aspects of the disclosed embodiment a method comprises:

providing an articulated arm coupled to a drive section for driving articulation motion of the articulated arm, the drive section having at least one motor;

operably coupling a machine controller to the drive section so as to control the at least one motor for moving the articulated arm from one location to a different other location; and operably coupling, for input/output, an adapter pendant to the machine controller with a machine controller interface of the adapter pendant, the adapter pendant having another interface, different from the machine controller interface and configured for operably connecting with a fungible smart mobile device having predetermined user operable device functionality characteristics resident on the fungible smart mobile device, wherein the other interface has connectivity configuration so that mating of the fungible smart mobile device with the other interface effects close coupling, via the adapter pendant, of at least one of the user operable device functionality characteristics of the fungible smart mobile device mated with the machine controller so that the at least one of the user operable functionality characteristics of the fungible smart mobile device, mated to the other interface, defines a close coupled user selectable input/output of the semiconductor process transport apparatus.

In accordance with one or more aspects of the disclosed embodiment the at least one of the user operable device functionality characteristics is a graphical user interface of the fungible smart mobile device that is close coupled via the adapter pendant with the machine controller so as to effect a close coupled user interface of the transport apparatus.

In accordance with one or more aspects of the disclosed embodiment the at least one of the user operable device functionality characteristics is at least one sensor resident on the smart device.

In accordance with one or more aspects of the disclosed embodiment the at least one of the user operable device functionality characteristics is a data logging function resident on the smart device.

In accordance with one or more aspects of the disclosed embodiment the at least one of the user operable device functionality characteristics is a graphic display function on the fungible: smart mobile device configured to graphically display at least one user selectable teaching parameter of teaching articulated motion of the articulated arm.

In accordance with one or more aspects of the disclosed embodiment the at least one of the user operable device functionality characteristics at least one of a recording function resident on the fungible smart mobile device, and at least one of a graphic display function on the fungible smart mobile device configured to graphically display a time record of at least one recorded arm motion parameter of the articulated motion of the articulated arm.

In accordance with one or aspects the more of disclosed embodiment the method further comprises automatically enabling configuration of the at least one of the user operable device functionality characteristics upon user initialization of the fungible smart mobile device mated to the adapter pendant.

In accordance with one or more aspects of the disclosed embodiment the connectivity configuration is a plug and play connectivity configuration, and is at least one of a short or near field radio frequency coupling and a universal serial bus port coupling.

In accordance with one or more aspects of the disclosed embodiment the input/output defined by the at least one of the user operable device functionality characteristics has an arrangement that embodies a motion teaching control for effecting teaching the machine controller motion control of the articulated arm from the one location to the other location.

In accordance with one or aspects of the disclosed embodiment the user operable device functionality charac- teristics includes a graphical user interface the fungible smart mobile device, the method further comprising defin- ing, with the graphical user interface, a motion teaching control input/output interface for effecting teaching the machine controller motion control of the articulated arm from the one location to the other location.

In accordance with one or more aspects of the disclosed embodiment the adapter pendant includes one or more of an integral emergency stop switch, an emergency machine off switch, and an emergency system off switch.

In accordance with one or more aspects of the disclosed embodiment the adapter pendant has an integral live-man switch.

In accordance with one or more aspects of the disclosed embodiment the connectivity configuration of the other interface is disposed so that mating of the fungible smart mobile device with the other interface initializes a lockout (or limited access/functionality) of at least another prede- termined user operable functionality characteristic on the fungible smart mobile device.

In accordance with one or more aspects of the disclosed embodiment at least one of the one location and the other location is a workpiece holding station in a semiconductor processing apparatus.

In accordance with one or more aspects of the disclosed embodiment the adapter pendant includes an integral mode selection switch.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of the appended claims. Further, the mere fact that different features are recited in mutually different dependent or independent claims does not indicate that a combination of these features cannot be advantageously used, such a combination remaining within the scope of the aspects of the disclosed embodiment.

What is claimed is:

1. A semiconductor process transport apparatus compris- ing:
 a drive section with at least one motor;
 an articulated arm coupled to the drive section for driving articulation motion of the articulated arm;
 a machine controller operably coupled to the drive section so as to control the at least one motor for moving the articulated arm from one location to a different other location; and
 an adapter pendant having a machine controller interface operably coupling the adapter pendant for input/output with the machine controller, the adapter pendant having another interface, different from the machine controller interface and configured for operably connecting with a fungible smart mobile device having predetermined resident user operable device functionality characteris- tics resident on the fungible smart mobile device;
 wherein the another interface has a connectivity configu- ration that communicates with at least one of the resident user operable device functionality characteris- tics of the fungible smart mobile device coupled with the another interface and defines a motion control input/output to the machine controller for motion con- trol of the articulated arm from the one location to the other location, and wherein the adapter pendant has a three-position live man switch.

2. The semiconductor process transport apparatus of claim 1, wherein configuration of the at least one of the resident user operable device functionality characteristics is automatically enabled upon user initialization of the fun- gible smart mobile device mated to the adapter pendant.

3. The semiconductor process transport apparatus of claim 1, wherein the connectivity configuration is a plug and play connectivity configuration, and is at least one of a short or near field radio frequency coupling and a universal serial bus port coupling.

4. The semiconductor process transport apparatus of claim 1, wherein the input/output, to the machine controller, defined by the at least one of the resident user operable device functionality characteristics has an arrangement that embodies a motion teaching control for effecting teaching the machine controller motion control of the articulated arm from the one location to the other location.

5. The semiconductor process transport apparatus of claim 1, wherein the resident user operable device function- ality characteristics includes a graphical user interface of the fungible smart mobile device that is configured to define a motion teaching control input/output interface for effecting teaching the machine controller motion control of the articu- lated arm from the one location to the other location.

6. The semiconductor process transport apparatus of claim 1, wherein the adapter pendant includes one or more of an integral emergency stop switch or emergency machine off switch or emergency system off switch.

7. The semiconductor process transport apparatus of claim 1, wherein the connectivity configuration of the another interface is disposed so that mating of the fungible smart mobile device with the another interface initializes a lockout, or limited access/functionality, of at least another predetermined resident user operable functionality charac- teristic on the fungible smart mobile device.

8. The semiconductor process transport apparatus of claim 1, wherein at least one of the one location and the other location is a workpiece holding station in a semicon- ductor processing apparatus.

9. The semiconductor process transport apparatus of claim 1, wherein the adapter pendant includes an integral mode selector switch.

10. The semiconductor process transport apparatus of claim 1, wherein the three-position live man switch is an off-on-off switch.

11. A method comprising:
 providing an articulated arm coupled to a drive section for driving articulation motion of the articulated arm, the drive section having at least one motor;
 operably coupling a machine controller to the drive sec- tion so as to control the at least one motor for moving the articulated arm from one location to a different other location; and
 operably coupling, for input/output, an adapter pendant to the machine controller with a machine controller inter- face of the adapter pendant, the adapter pendant having another interface, different from the machine controller interface and configured for operably connecting with a fungible smart mobile device having predetermined resident user operable device functionality characteris- tics resident on the fungible smart mobile device;

wherein the another interface has a connectivity configuration that communicates with at least one of the resident user operable device functionality characteristics of the fungible smart mobile device coupled with the another interface and defines a motion control input/output to the machine controller for motion control of the articulated arm from the one location to the other location, and wherein the adapter pendant has a three-position live man switch.

12. The method of claim 11, further comprising automatically enabling configuration of the at least one of the resident user operable device functionality characteristics upon user initialization of the fungible smart mobile device mated to the adapter pendant.

13. The method of claim 11, wherein the input/output, to the machine controller, defined by the at least one of the resident user operable device functionality characteristics has an arrangement that embodies a motion teaching control for effecting teaching the machine controller motion control of the articulated arm from the one location to the other location.

14. The method of claim 11, wherein the resident user operable device functionality characteristics includes a graphical user interface of the fungible smart mobile device, the method further comprising defining, with the graphical user interface, a motion teaching control input/output interface for effecting teaching the machine controller motion control of the articulated arm from the one location to the other location.

15. The method of claim 11, wherein the connectivity configuration of the another interface is disposed so that mating of the fungible smart mobile device with the another interface initializes a lockout, or limited access/functionality, of at least another predetermined resident user operable functionality characteristic on the fungible smart mobile device.

16. The method of claim 11, wherein at least one of the one location and the other location is a workpiece holding station in a semiconductor processing apparatus.

17. The method of claim 11, wherein the adapter pendant includes an integral mode selector switch.

18. The method of claim 11, wherein the three-position live man switch is an off-on-off switch.

\* \* \* \* \*